United States Patent [19]
Watanabe

Patent Number: 5,724,289
Date of Patent: Mar. 3, 1998

[54] NONVOLATILE SEMICONDUCTOR MEMORY CAPABLE OF SELECTIVELY PERFORMING A PRE-CONDITIONING OF THRESHOLD VOLTAGE BEFORE AN ERASE SELF-TEST OF MEMORY CELLS AND A METHOD RELATED THEREWITH

[75] Inventor: Hisayoshi Watanabe, Kawasaki, Japan

[73] Assignee: Fujitsu Limited, Kawasaki, Japan

[21] Appl. No.: 689,794

[22] Filed: Aug. 13, 1996

Related U.S. Application Data

[63] Continuation-in-part of Ser. No. 291,899, Aug. 17, 1994, abandoned.

[30] Foreign Application Priority Data

Sep. 8, 1993 [JP] Japan .................. 5-223718

[51] Int. Cl.$^6$ .................................. G11C 29/00
[52] U.S. Cl. ............ 365/201; 365/185.24; 365/185.33; 365/236; 365/195; 365/228
[58] Field of Search .................. 365/185.24, 185.29, 365/185.33, 201, 236, 195, 63, 228

[56] References Cited

U.S. PATENT DOCUMENTS

| | | | |
|---|---|---|---|
| 5,402,380 | 3/1995 | Kumakura et al. | 365/210 |
| 5,537,357 | 7/1996 | Merchant et al. | 365/218 |
| 5,574,684 | 11/1996 | Tomoeda | 365/185.04 |

*Primary Examiner*—David C. Nelms
*Assistant Examiner*—Andrew Q. Tran
*Attorney, Agent, or Firm*—Armstrong, Weterman, Hattori, McLeland & Naughton

[57] ABSTRACT

An electrically data chip-erasable nonvolatile semiconductor memory wherein a write instruction directing a pre-erase data write is disabled and then a one-time test data write and an automated data erase is executed according to an erase instruction. The semiconductor memory is provided with an automated count setter for supplying a preset write count according to the applied voltage state of the test mode terminals in an automated data erase and rewrite test and a control circuit for controlling data write and erase in response to the write count from the automated count setter. A test method of the nonvolatile semiconductor memory comprises the steps of disabling a write instruction directing a pre-erase data write (a pre-programming), and executing a one-time test data write and a subsequent automated data erase according to an erase instruction. Another test method of the nonvolatile semiconductor memory comprises the steps of assigning the counts of pre-erase data writes to a plurality of test mode terminals in advance, in an automated erase and rewrite test, applying a test voltage higher than a usually used one to a selected one of the test mode terminals, executing a pre-programming according to a write count derived from the voltage state of the selected test mode terminal, and then executing an erase test data programming and an auto-erase.

10 Claims, 16 Drawing Sheets

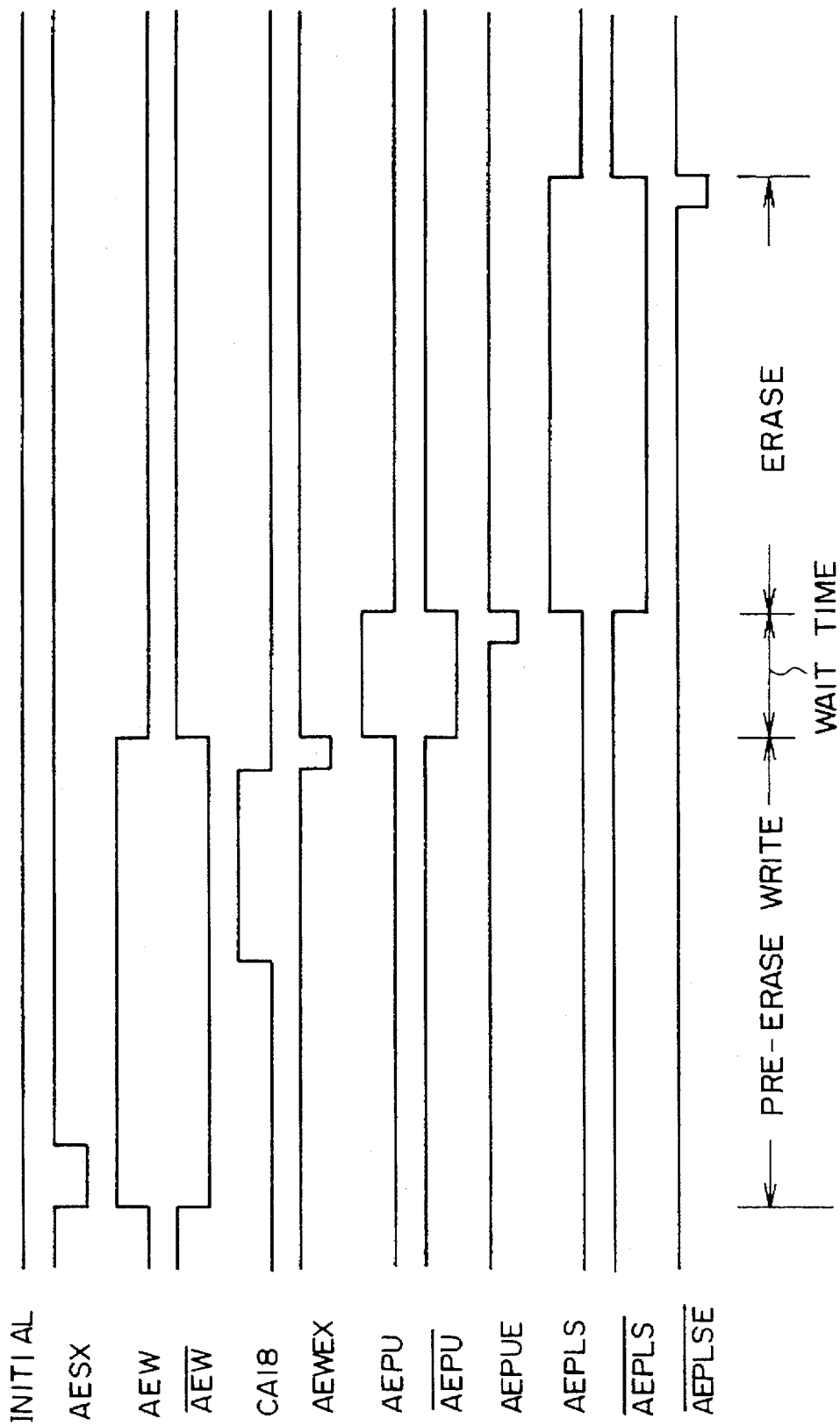

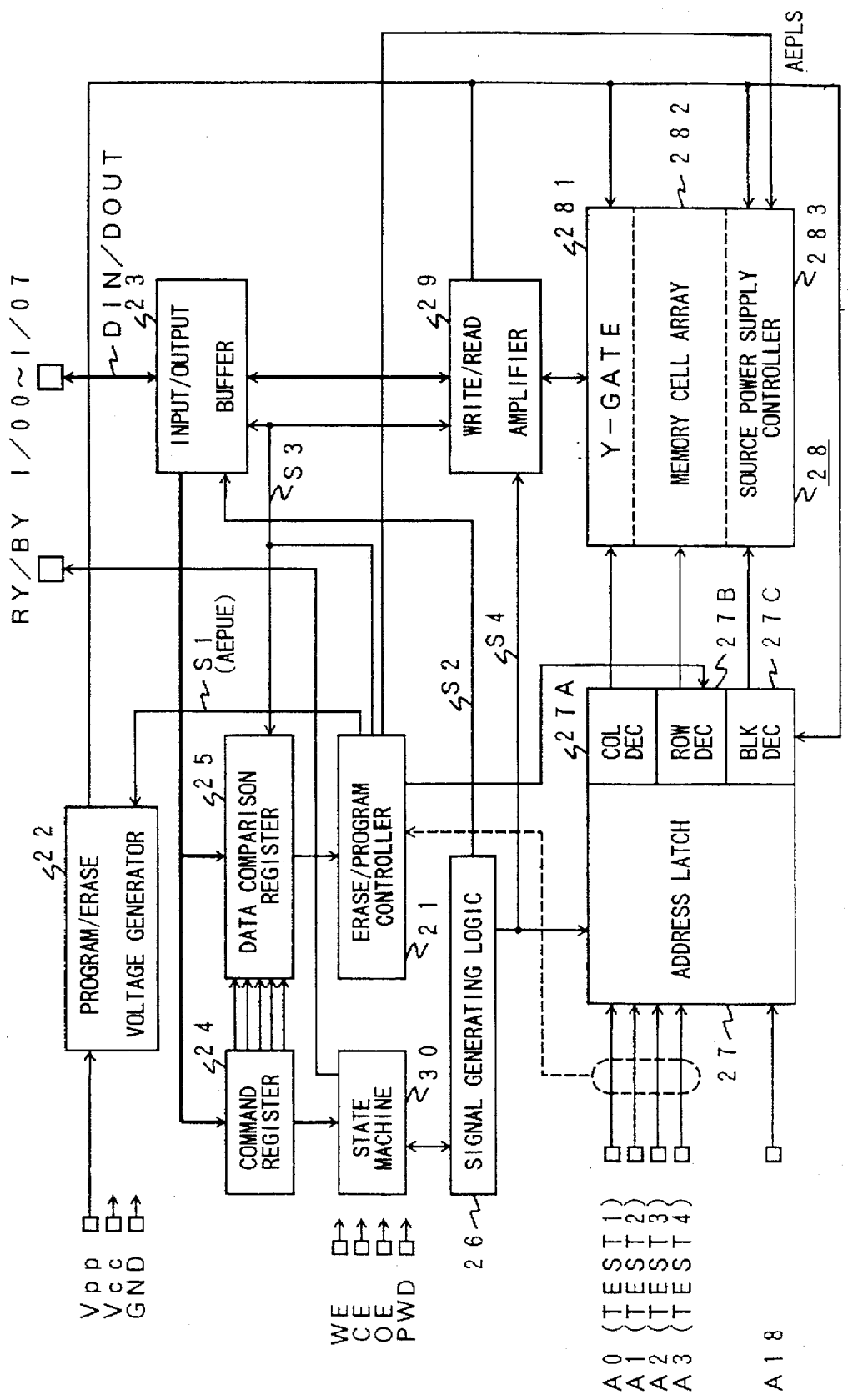
F I G. 5

FIG. 7
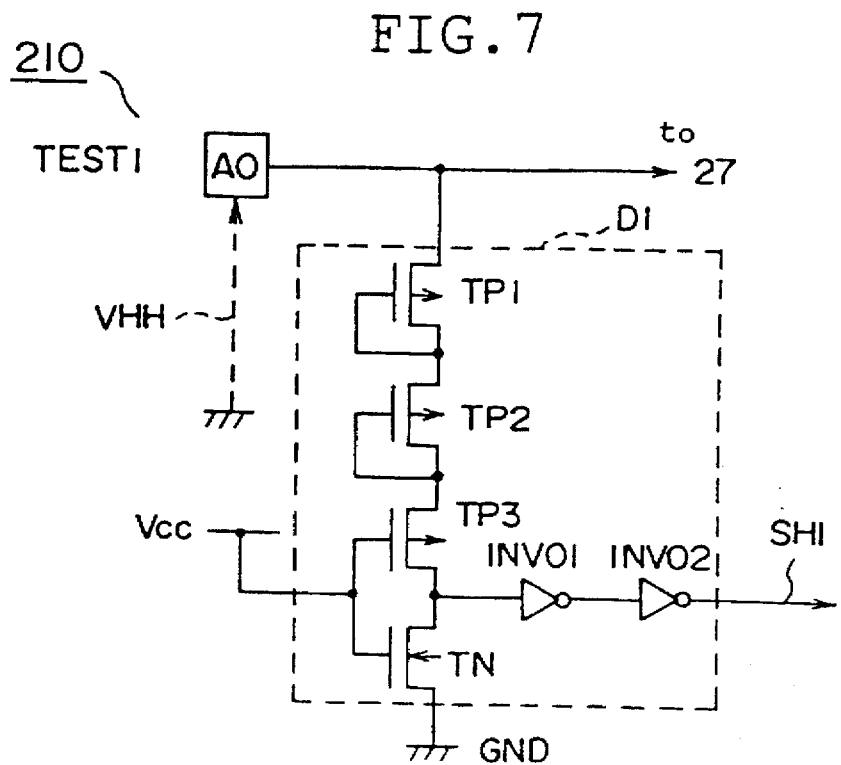
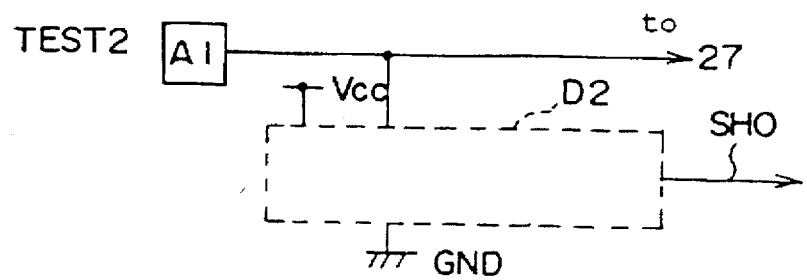
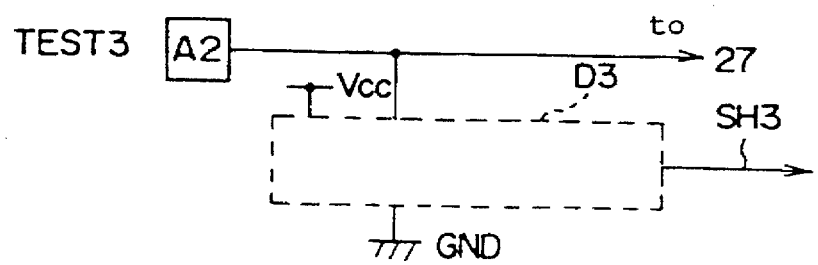
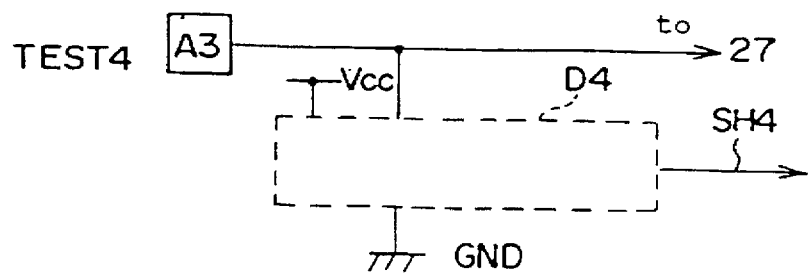

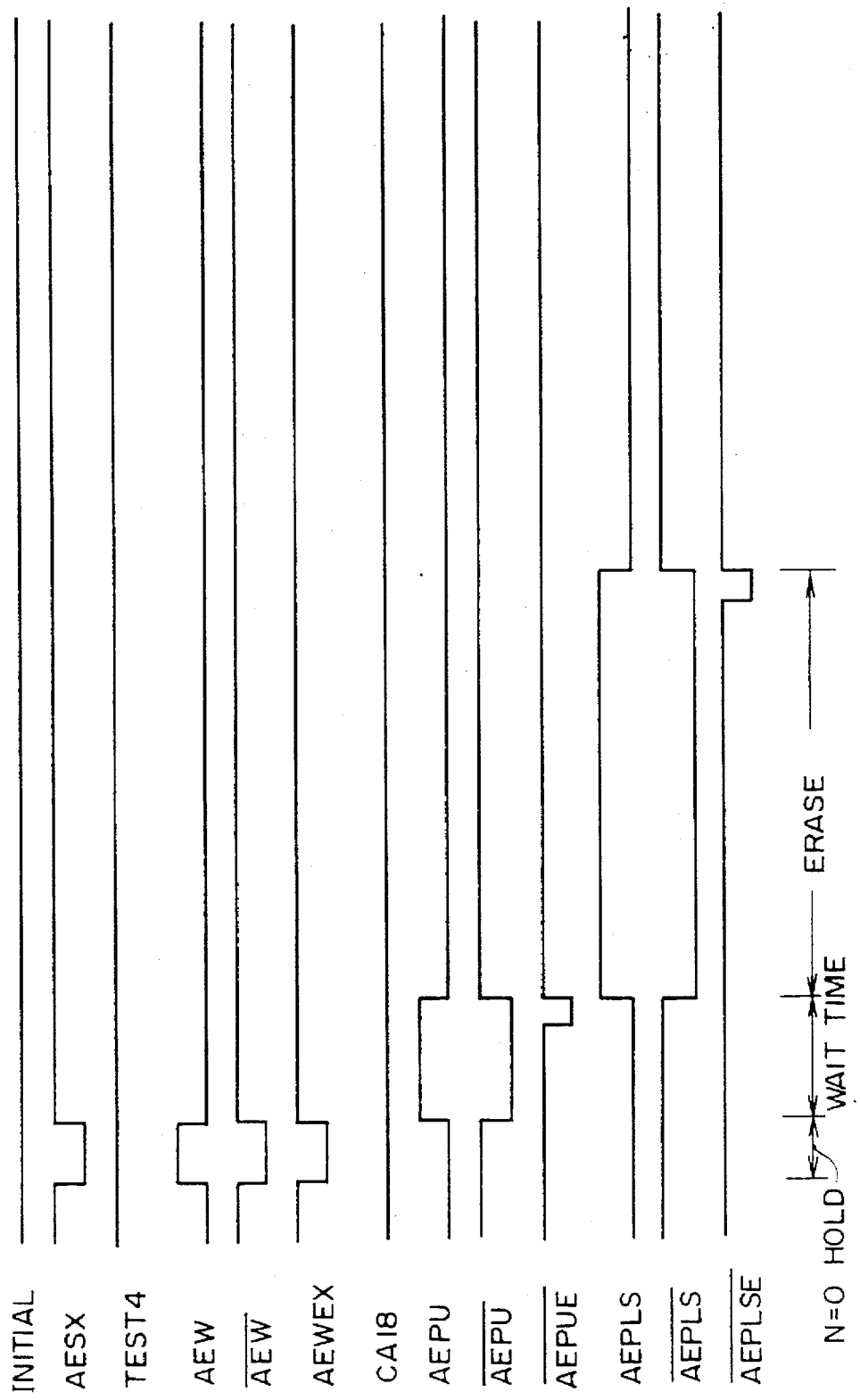

5,724,289

NONVOLATILE SEMICONDUCTOR MEMORY CAPABLE OF SELECTIVELY PERFORMING A PRE-CONDITIONING OF THRESHOLD VOLTAGE BEFORE AN ERASE SELF-TEST OF MEMORY CELLS AND A METHOD RELATED THEREWITH

This application is a continuation-in-part of application Ser. No. 08/291,899, filed Aug. 17, 1994, now abandoned.

BACKGROUND OF THE INVENTION

1. Field of the Invention

The present invention relates generally to a non-volatile semiconductor memory and a test method for the memory, and more particularly to a flash memory formed of an electrically data writable and all data erasable read only memory in which a self-test function is provided and a charge injection is performed before all data erasure to equalize threshold values of memory cells with each other.

2. Description of the Prior Art

A non-volatile semiconductor memory in which a control algorithm possible to be used in various types of information processing apparatuses is stored as pieces of program data has been used while the information processing apparatuses have higher performances and multifunction. As a representative device, a flash memory is well-known. In the flash memory, pieces of data can be electrically programmed, the programmed data can be read out, and all of the programmed data can be electrically erased at a time.

Next, a prior art is described. For example, in FIG. 1A, a flash memory formed of an electrically data writable and all data erasable read only memory, in which a self-test function is provided and a charge injection is performed before all data erasure to equalize threshold values of memory cells with each other, is composed of a storage section 1, a writing and reading unit 2 and an erase/program controller 3. The storage section 1 is composed of a plurality of memory cells 10, and each of the memory cells 10 has a control gate G and a floating gate FG, as shown in FIG. 1A. For example, each of the memory cells 10 is formed of an n type field-effect transistor, peripheral circuits of each of the memory cells 10 are described later with reference to FIG. 1C.

In the writing and reading unit 2, a piece of data is written in the storage section 1 according to a writing high voltage, a write control signal and a write address, and a piece of data is read out from the storage section 1 according to a read control signal and a read address. Also, in the writing and reading unit 2, the writing high voltage and an erasing high voltage (hereinafter, called a VPP voltage) are output to the storage section 1 when erasing the data.

In addition, in the writing and reading unit 2, when an erasing test of all of pieces of data is performed, a write instruction and an erase instruction transferred from an external test apparatus are decoded, and an automatic erasing signal (hereinafter, called an AE signal), an automatic erasing start signal (hereinafter, called an AESX signal), an erasing voltage control signal (hereinafter, called an AEPUE signal), an all data erasing signal (hereinafter, called an AEPLSE signal) and an initial signal (hereinafter, called an INITX signal) obtained as a result of the decoding are output to the erase/program controller 3. Also, in the writing and reading unit 2, a piece of data is read out from one memory cell 10, and an erasing-defective cell 10 is detected.

Here, the write instruction denotes a piece of information for equalizing threshold voltages of all of the memory cells 10 with each other at a high state after charges are injected in the memory cells 10. When the write instruction is executed before all of pieces of data stored in the memory cells 10 are erased, ununiformity of the threshold voltages in the all of memory cells 10 can be suppressed. The erase instruction denotes a piece of information for performing both a write operation in which pieces of erasing data (or an erasing charge) is written to the memory cells 10 and an erasing operation in which pieces of data written in all of the memory cells 10 are erased at a time.

The AE signal denotes a signal indicating an automatic erasing operation in which pieces of data written in all of the memory cells 10 are automatically erased at a time, the AESX signal denotes a signal for starting a data erasing operation, the AEPUE signal denotes a signal for allowing the output of the VPP voltage, the AEPLSE signal denotes a signal for erasing pieces of data written in all of the memory cells 10 at a time, and the INITX signal is a signal for resetting each of latching circuits.

In the erase/program controller 3, the input and output of the storage section 1 and the writing and reading unit 2 at a charge injecting time or a data erasing time are controlled. For example, as shown in FIG. 1B, the erase/program controller 3 is provided with a write end detecting circuit 4, a plurality of latching circuits 5 to 7, an oscillator 8, inverters 2 and 3, and a counting circuit 9.

The write end detecting circuit 4 is composed of a negative logical multiply circuit (hereinafter, called an NAND circuit) having two inputs, an inverted INV1, and a trigger circuit 4A. In the write end detecting circuit 4, an automatic pre-erasing write end signal (hereinafter, called an AEWEX signal) is output to the latching circuits 5 and 6 according to the AE signal, an automatic pre-erasing write signal (hereinafter, called an AEW signal) and a final value counting signal (hereinafter, called a CAn signal).

In the latching circuit 5, the AESX signal is latched according to the INITX signal and the AEWEX signal, and the AEW signal and an inverted AEW signal AEW are output. Here, the inverters 2 and 3 are respectively a circuit for inverting an output signal of the latching circuit 5. The AEW signal is fed back to the write end detecting circuit 4. In the latching circuit 6, the AEPUE signal is latched according to the INITX signal and the AEWEX signal, and an erasing voltage control signal (hereinafter, called an AEPU signal) and an inverted AEPU signal AEPU are output. The inverted AEPU signal is fed back to the latching circuit 6.

In the latching circuit 7, the AEPLSE signal is latched according to the INITX signal and the AEPUE signal, and an all data erasing pulse signal (hereinafter, called an AEPLS signal) and an inverted AEPLS signal AEPLS are output.

In the oscillator 8, a clock signal and an inverted clock signal are generated. In the counting circuit 9, an address is generated by receiving the clock signal transferred from the oscillator 8, and a counting signal is generated. For example, a repetition number of write operations is counted in the counting circuit 9 on condition that an upper limit of the repetition number of write operations is 100, and a final value counting signal (hereinafter, called an CAn signal) is output to the writing end detecting circuit 4.

As shown in FIG. 1C, the control gate G of each of the memory cells 10 is connected to a word line WL, a drain of each of the memory cells 10 is connected to a bit line BL, and a source of each of the memory cells 10 is connected to a source power supply controller 283. The word line WL is connected to a row decoder 27B, and the row decoder 27B and the source power supply controller 283 are connected to the erase/program controller 3.

In each of the memory cells 10, a VPP voltage supplied from the erase/program controller 3 to the row decoder 27B when injecting charges to the memory cells 10 is received, the charges are injected to the floating gates FG, and pieces of data are stored in the memory cells 10. Also, a VPP voltage supplied from the erase/program controller 3 to the source power supply controller 283 when erasing the data stored in the memory cells 10 is received in each of the memory cells 10, and hot electrons are drawn out from the floating gates FG of the memory cells 10 through a Fowler-Nordheim tunnel.

Next, an operation in which pieces of data stored in a flash memory are erased is described with reference to FIGS. 1C to 1E. Initially, in cases where charges are injected to the memory cells 10 to equalize the threshold voltages of all of the memory cells 10 at a pre-erasing with each other, in a flow chart shown in FIG. 1D, a write instruction is initially decoded in the writing and reading unit 2 in a step P1. As a result of the decoding, an AE signal, an AESX signal, an AEPUE signal, an INITX signal and an AEPLSE signal are generated. These signals are output to the erase/program controller 3. In the write end detecting circuit 4 of the erase/program controller 3, an AEWEX signal is output to the latching circuits 5 and 6 according to the AE signal, an AEW signal and a CAn signal shown in FIG. 2.

Also, in the latching circuit 5, the AESX signal is latched according to the INITX signal and the AEWEX signal, and the AEW signal and an inverted AEW signal AEW are output to the row decoder 27B. In FIG. 2, a pulse width of the AEW signal denotes a write period at a pre-erasing of the data.

In the latching circuit 6, the AEPUE signal is latched according to the INITX signal and the AEWEX signal, and an AEPU signal and an inverted AEPU signal are output to the program/erase voltage generator 22. In FIG. 2, a pulse width of the AEPU signal denotes a waiting time from a write operation performed at a pre-erasing to a data erasing operation.

In the latching circuit 7, the AEPLSE signal is latched according to the INITX signal and the AEPUE signal, and an AEPLS signal and an inverted AEPLS signal are output to the source power supply controller 283. In FIG. 2, a pulse width of the AEPLS signal denotes a data erasing period.

Thereafter, in a step P2, pieces of data are written in the memory cells 10 by the function of the writing and reading unit 2. Here, to inject charges into the floating gates FG of the memory cells 10 shown in FIG. 1C, a VPP voltage is supplied to each of the control gates G of the memory cells 10 by the function of the writing and reading unit 2. The VPP voltage is supplied from the program/erase voltage generator 22 to the row decoder 27B according to the AEPUE and an inverted AEPUE signal.

Also, a word line WL of a memory cell 10 is selected by the row decoder 27B in which the AEW signal and the inverted AEW signal are input. The source power supply controller 283 in which the AEPLS signal and an inverted AEPLS signal are output connects the source of the memory cell 10 to a ground line GND. Therefore, a charge is injected into a floating gate FG of the memory cell 10 by receiving a VPP voltage supplied from the erase/program controller 3 to the row decoder 27B.

Thereafter, in a step P3, a piece of data is read out from the memory cell 10 by the function of the writing and reading unit 2. In this case, the data is read out bit by bit from the storage section 1 according to a read control signal by the function of the writing and reading unit 2.

Thereafter, in a step P4, the read data and a piece of expected value data are compared with each other in the writing and reading unit 2, and it is judged whether or not a threshold value Vth of the memory cell is increased. In cases where the threshold value Vth is sufficiently increased by sufficiently injecting the charge into the floating gate FG of the memory cell 10 (YES), a data write operation at a pre-erasing is finished. In contrast, in cases where the threshold value Vth is not sufficiently increased by not sufficiently injecting the charge into the floating gate FG of the memory cell 10 (NO), the procedure proceeds to a step P5.

In the step P5, a charge-shortage cell is detected. Thereafter, in a step P6, a repetition number of write operations is counted by one in a counter 9 of the erase/program controller 3, and the procedure returns to the step P2. Thereafter, a charge is again injected into the charge-shortage cell, and a piece of data is read out from the cell in the step P3 and is again compared with the expected value data. This injection of the additional charge is repeated for each of the memory cells 10 until the charge is sufficiently injected on condition that an upper limit of the repetition number of write operations performed for each of the memory cells 10 is 100. During the repetition of the write operation, a clock signal of the oscillator 8 is input to the counter 9, and a CAn signal is output to the write end detecting circuit 4.

Thereafter, in cases where the threshold values Vth of all of the memory cells 10 are increased in the step P4 (YES), the charge injection (or the data write operation) performed at the pre-erasing is finished. Therefore, the threshold values Vth of all of the memory cells 10 can be equalized at the same high level.

As is described above, after the threshold values Vth of all of the memory cells 10 are equalized with each other by writing the data in the memory cells 10 at the pre-erasing, the erasing of the data is performed at a time. In detail, as a flow chart is shown in FIG. 1E, in a step P1, an erase instruction is decoded in the writing and reading unit 2. As a result of the decoding, an AE signal, an AESX signal, an AEPUE signal, an INITX signal and an AEPLSE signal are output to the erase/program controller 3.

In the erase/program controller 3, an AEWEX signal is output to the latching circuits 5 and 6 according to the AE signal, an AEW signal and a CAn signal in the write end detecting circuit 4, in the same manner as in the decoding of the write instruction.

In the latching circuit 5, the AESX signal is latched according to the INITX signal and the AEWEX signal, and the AEW signal and an inverted AEW signal are output to the row decoder 27B. In the latching circuit 6, the AEPUE signal is latched according to the INITX signal and the AEWEX signal, and an AEPU signal and an inverted AEPU signal are output to the program/erase voltage generator 22. In the latching circuit 7, an AEPLSE signal is latched according to the INITX signal and the AEPUE signal, and the AEPLS signal and an inverted AEPLS signal are output to the source power supply controller 283.

Thereafter, in a step P2, pieces of data are written in the memory cells 10. Thereafter, in a step P3, all of the data are erased at a time in the writing and reading unit 2. Also, a VPP voltage supplied from the erase/program controller 3 to the source power supply controller 283 is received in each of the memory cells 10, and hot electrons are drawn out from the floating gates FG of the memory cells 10 through a Fowler-Nordheim tunnel.

In this case, the memory cells 10 are cut off from the word lines WL according to the AEW signal and the inverted AEW signal by the function of the row decoder 27B, and the control gates G of the memory cells 10 are connected to the ground line GND. In the source power supply controller 283, the sources S of the memory cells 10 are cut off from the ground line GND and are connected to the program/erase voltage generator 22, and the voltages VPP are supplied to the sources S of the memory cells 10 according to the AEPLS signal and the inverted AEPLS signal.

Thereafter, in a step P4, the data are read out from the storage section 1 to the writing and reading unit 2. In this case, the data are read out bit by bit from the storage section 1 to the writing and reading unit 2 according to a read control signal and a read address. Here, the control gates G of the memory cells 10 are cut off from the ground line GND according to the AEW signal and the inverted AEW signal and are connected to the word lines WL by the function of the row decoder 27B. Also, the sources of the memory cells 10 are cut off from the program/erase voltage generator 22 according to the AEPLS signal and the inverted AEPLS signal and are connected to the ground line GND by the function of the source power supply controller 283.

Thereafter, in a step P5, to verify whether the data of all of the memory cells 10 are erased, each of the read data is compared with a piece of expected value data in the writing and reading unit 2. Thereafter, in a step P6, it is judged in the writing and reading unit 2 whether or not the data of all of the memory cells 10 are erased. Here, in cases where the data of all of the memory cells 10 are erased (YES), a data erase test is finished.

In contrast, in cases where the data of all of the memory cells 10 are not erased (NO), the procedure proceeds to a step P7, and it is judged whether or not a repetition number of erase operations reaches a prescribed number. In cases where the repetition number of erase operations does not reach a prescribed number (NO), the procedure proceeds to a step P8, and a setting number is decreased by one. Thereafter, the procedure returns to the step P3, the data of all of the memory cells 10 are erased at a time by the function of the writing and reading unit 2, the data are read out from the storage section 1 in the step P4, the data erasing is verified in the step P5, and it is judged whether or not the data of all of the memory cells 10 are set to "1" because of the erasing of the data.

By repeating the procedure from the step 3 to the step P8, the data of all of the memory cells 10 are repeatedly erased on condition that an upper limit of the repetition number or erasing operations is the prescribed number, and it is tested whether or not the erasing operations are normally operated. Thereafter, in cases where the erasing of the data of all of the memory cells 10 is verified in the step P5 or in cases where the erasing operation is repeated by the prescribed number in the step P6 (YES), the data erasing is finished. When the data erasing test is finished, a result of the test is transferred to an external testing apparatus.

SUMMARY OF THE INVENTION

It is an object of the invention to reduce the time taken for a test of data rewrite or data erase by devising the arranging method of a rewrite test and an erase test, seize the erase characteristic precisely by omitting the write test prior to an auto-erase and make a rewrite test with only an auto-erase by making the number of write operations before an auto-erase chargeable.

According to an automatically and electrically erasable nonvolatile semiconductor memory of the invention, the program command for programming before an auto-erase is disabled, and an erase data write and an auto-erase are executed according to an erase instruction.

Specifically, in the inventive nonvolatile semiconductor memory, a control means is provided with an automated count setter, which is connected to the test mode terminals which serve both as regular input terminals and test terminals.

When a test voltage higher than the usually used voltage is applied to any of the test mode terminals, the state of the applied voltage to the test mode terminal is detected by the automated count setter. A preset count of data writes before auto-erase is altered by the automated count setter automatically selecting one of the predetermined write counts on the basis of the detected applied voltage state.

Also, if applying the test voltage higher than the usually used voltage is applied to any of the test mode terminals, an auto-erase test can be made by omitting a data write operation before auto-erase and only repeating an erase operation according to the automated count setter.

A test method of a nonvolatile semiconductor memory according to the invention comprises the steps of disabling a program command for writing data before an auto-erase, writing erase data by an erase command and then executing the auto-erase.

According to the inventive test method of a nonvolatile semiconductor memory, write counts including zero are allocated to two or more test mode terminals, to one of which a test voltage higher than the usually used voltage in an automated erase and write test.

Thus, by means of a selection of the test mode terminals, data writes preceding an auto-erase can be omitted and the count of writes preceding an auto-erase can be changed. And, thereby, an automated rewrite only based on an erase command and a speedy and precise cycling test of erase and write becomes possible.

Therefore, the present invention enables us to obtain a more precise erase characteristic as compared with the related art and provides high efficiency of tests and evaluation. It also contributes to the supply of nonvolatile semiconductor memories such as flash memories with high reliability.

BRIEF DESCRIPTION OF THE DRAWINGS

FIG. 2 is a diagram showing wave-forms in operation of the erase/write controller shown in FIG. 1A;

FIG. 5 is a diagram showing a overall arrangement of a flash memory according to a preferred embodiment of the invention;

FIG. 7 is a diagram showing an internal structure of the voltage detector in the erase/write controller shown in FIG. 6;

FIG. 13 is a waveform chart showing the operation of the flash memory shown in FIG. 5.

DETAILED DESCRIPTION OF THE PREFERRED EMBODIMENT

According to the related art of the invention, in an auto-program and erase test, a data write operation is first executed and subsequently an auto-erase operation is executed, on the basis of the state of applied voltages of specific terminals, a write and an erase command from a tester apparatus.

In this case, since the count of writes before the auto-erase is fixed, a write operation before an erase can not be omitted nor can the write count be altered. This causes the problems that it takes long time for the test and that a precise erase characteristic can not be obtained.

Specifically, in a cycling test wherein a write and an erase (or a rewrite) of data are repeated, since a series of a write and an erase command must be executed alternately on the basis of a test algorithm, it takes a significant time to decode all such commands. Since the auto-erase operation must be executed with an erase command after a fixed count of auto-programs have been invariably executed the test takes time.

Thus, in an auto-erase of the related art, the pre-programming prevents an erase characteristic from being precisely obtained. This is because the decoding of program instructions which are invariably transferred before an auto-erase in a test algorithm takes additional time, which is added to the erase time showing the erase performance of the flash memory.

It is noted that a method of testing a memory by detecting the state of applied voltages to its specific terminals utilizes a power supply voltage detector circuit for which the applicant of the present invention has previously gotten a patent (Japan Patent Publication No. 60,789 in 1989).

On the other hand, in a principal nonvolatile semiconductor memory of the invention, a disabling means is provided for disabling a write instruction causing the menu memory cells to be filled up with data before a chip-erase operation so as to level the threshold voltage of the gate of a transistor constituting each cell. An execution means is provided for executing data write and data erase according to an erase instruction is supplied after the write instruction.

Further an electrically chip-erasable nonvolatile semiconductor memory comprises output means for outputting the count for data writes according to state of data in memory cells before a chip-erase operation and a count selection signal. A control means is provided for writing data to memory cells according to the data write count from the output means and executing data write and erase according to an erase instruction.

Figure 3:
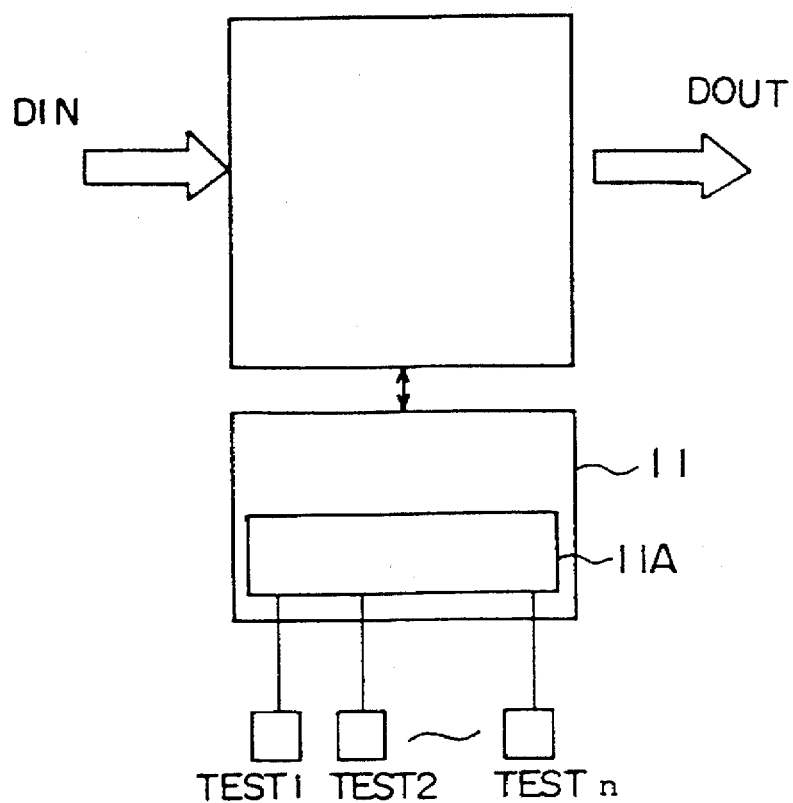
FIG. 3 is a diagram showing a principle arrangement of a nonvolatile semiconductor memory and its test method according to the present invention.

More specifically, in an inventive nonvolatile semiconductor memory in which data DIN stored in its memory cells can be automatically and electrically erasable as shown in FIG. 3, control means 11 for controlling an erase and program operation is provided with a automated count setter 11A, which is connected to the test mode terminals $TEST_i$ [i=1, 2, 3, ... n] which serve both as regular input terminals and test terminals. In an auto-erase and program test, the automated count setter 11A outputs one of the preset write counts, $N_i$, in response to the detection of the state of applied voltages to the test mode terminals, where $N_i$ is a positive integer including zero.

Figure 4:
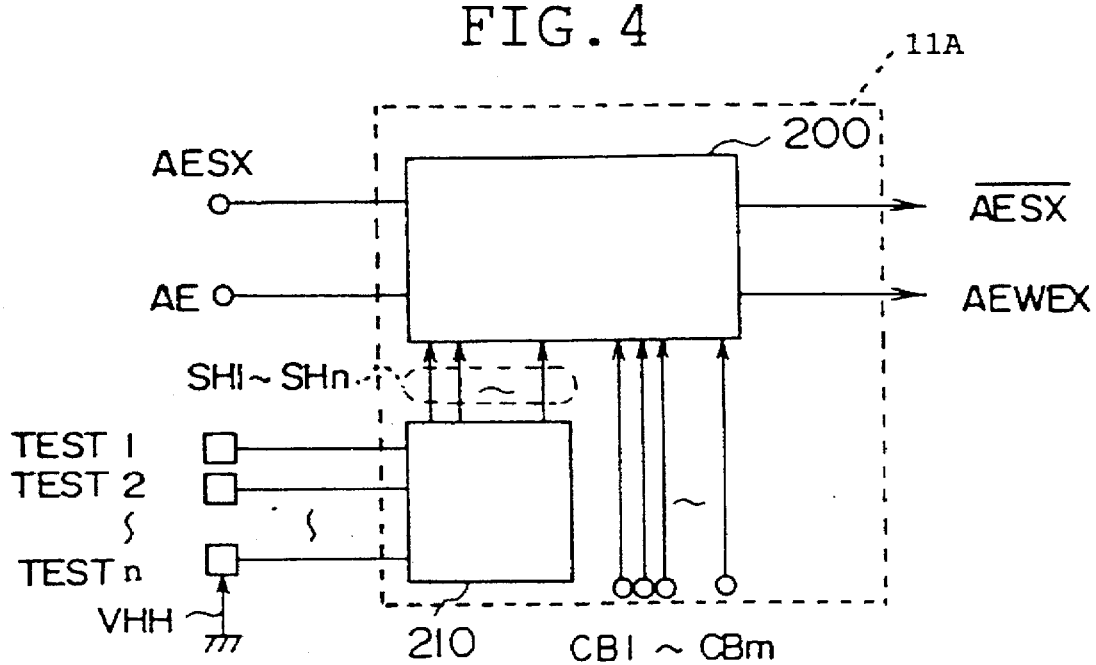
FIG. 4 is a diagram showing a principle arrangement of the automated count setter of a nonvolatile semiconductor memory shown in FIG. 3.

As shown in FIG. 4, the automated count setter 11A in the nonvolatile semiconductor memory of the invention includes a voltage detector 210 for detecting the state of the voltage applied to a specific test made terminal $TEST_i$ to output the count selection signal $SH_i$ and a timing signal generator 200 for generating a pre-programming termination signal AEWEX and the inverted version $\overline{AESX}$ of an auto-erase initiation signal AESX on the basis of the count selection signal $SH_i$ supplied from the voltage detector 210, an auto-erase initiation signal AESX, a pre-programming control signal AE and count setting signals CB1 through CBm the last three kinds of signals being supplied from some other component than the voltage detector 210.

A test method of an electrically chip-erasable nonvolatile semiconductor memory comprising the steps of disabling a write instruction which causes the memory cells to be filled up with data before chip-erase so as to level the threshold voltage of the gate of a transistor constituting each cells; and executing data write and data erase according to an erase instruction supplied after the write instruction.

Further, a test method of an electrically chip-erasable nonvolatile semiconductor memory comprising the steps of presetting a plurality of data write counts which each define the number of write operations before chip-erase and which differ from one another; selecting one of the preset data write counts in an automated erase and rewrite test; and executing data writes according to the selected data write count and executing data write and erase according to an erase instruction.

More specifically, according to the test method of the nonvolatile semiconductor memory of the invention; program counts $N_1$ through $N_n$ including zero are allocated for two or more test mode terminals $TEST_1$ through $TEST_n$; a test voltage higher than a usually used one is applied to a specific one of the test mode terminals $TEST_i$ through $TEST_n$; and in response to the selected test mode terminal TESTi, a corresponding write count Ni including zero is output.

Now, we discuss the operation of a principle nonvolatile semiconductor memory of the invention. In FIG. 4, if a test voltage higher than a usually used voltage, VHH, is applied to any one of test node terminals $TEST_1$ through $TEST_n$, e.g., $TEST_i$, then the voltage detector 210 in the automated count setter 11A detects the voltage higher than the usually used one VCC being applied to the terminal $TEST_i$. In response to the detection, the voltage detector 210 supplies a count selection signal $SH_i$ to the timing signal generator 200.

In the timing generator 200, a pre-programming termination signal AEWEX and the inverted version $\overline{AESX}$ of an auto-erase initiation signal AESX are generated on the basis of the count selection signal $SH_i$ supplied from the voltage detector 210, an auto-erase initiation signal AESX, a pre-programming control signal AE and count setting signals $CB_1$ through $CB_m$, the last three kinds of signals being supplied from some other component than the voltage detector 210.

Thus, the automated count setter 11A can select one out of the predetermined write counts, Ni, on the basis of the count selection signal $SH_i$. By doing this, it is possible to omit a test of a program before an auto-erase and to change the number of programs before an auto-rase.

As described above, according to the test method of the nonvolatile semiconductor memory of the invention two or more program counts $N_1$ through Nn including zero are allocated to test mode terminals $TEST_1$ through $TEST_n$ and a test voltage higher than a usually used one is applied to a specific one $TEST_i$ of the test mode terminals. Thus, if an erase command is issued to the memory when all of the test mode terminals $TEST_1$ through $TEST_n$ are in a unselected state, then out of recognition that the mode should not enter any test mode, a data write is executed once before an auto-erase and subsequently a pre-programming termination signal AEWEX and an auto-erase initiation signal AESX are generated for entering the auto-erase operation by the timing signal generator 200.

If a terminal, e.g., $TEST_n$ is selected out of the test mode terminals; $TEST_1$ through $TEST_n$, that is, the test voltage VHH is applied to the terminal $TEST_n$, the timing signal generator 200 generates a pre-programming termination signal AEWEX to omit a pre-programming ($N_n=0$) in an auto-erase and program test.

Thus, a pre-programming instruction can be disabled, that is, a data write before an auto-erase can be eliminated and thereafter an auto-erase test in which an erase operation is repeated is made by means of control means 11. Since a write count including zero can be selected instead of being fixed as is the case in the related art, a time period used for pre-programming operation is reduced and therefore a test period is reduced. Additionally, a precious erase characteristic can be obtained.

If any other test mode terminal $TEST_i$, other than $TEST_n$ is selected, that is, i≠n, then a pre-programming is executed $N_i$ times on the basis of the count selection signal $SH_i$ for selecting the corresponding write count $N_i$ among the predetermined write count $N_i$ through $N_{n-1}$, and a pre-programming termination signal AEWEX and an auto-erase initiation signal AESX is generated by the timing signal generator 200 to enter an erase operation.

In this way, a pre-programming count is selected according to the characteristic of the memory by means of an erase command and a selection among the test mode terminals $TEST_1$, through $TEST_n$ from the tester apparatus.

Referring to the drawings, we discuss some illustrative embodiments of the intention in the following.

As shown in FIG. 5, for example, an automatically and electrically chip-erasable memory in which the number of programs before an auto-erase is changeable and even made zero comprises an erase/program controller 21, a program/erase voltage generator 22, an input/output buffer 23, a command register 24, a data comparison register 25, a signal generating logic circuit 26, an address latch 27, a storage section 28, a write/read amplifier 29 and a status register 30.

Specifically, the erase/program controller 21 is an illustrative embodiment of the control means 11, a circuit for controlling an erase and a program of data DIN. If i=4 and $N_i=0, 2, 3$ and 10, for example, in an auto-erase and rewrite test, the erase/program controller 21 selects one out of the predetermined write counts 0, 2, 3 and 10 on the basis of the state of the applied voltages of the test mode terminals $TEST_1$ through $TEST_4$, to effectuate a program and erase control. The internal structure of the erase/program controller 21 will be detailed in connection with FIG. 6.

On the basis of control signals S1 supplied from the erase/program controller 21, the program/erase voltage generator 22 supplies an erase/program voltage VPP to the address latch 27, the storage section 28 and a program/read amplifier 29. The control signals S1 includes a pre-programming termination signal (hereinafter, referred to simply as a "signal AEWEX"), the inverted version of an auto-erase initiation signal, $\overline{AESX}$, and so forth which are supplied from latches 43 through 45 described below.

The input/output buffer 23 is a circuit for the input/output of data, e.g., 8-bit data DIN on the basis of control signals S3 supplied from the controller 21 and control signals S2 supplied from the signal generating logic circuit 26.

The command register 24 is a circuit for decoding an 8-bit command and supplying the resultant signal S0 to the status register 30. The data comparison register 25 is a circuit operative on the basis of the control signals S3 for comparing data DIN to program with read programmed data in an auto-erase and rewrite test or presetting a path in case of an erase command and an erase test and supplying the resultant data to an erase/program controller 21.

The signal generating logic circuit 26 is a circuit for generating control signals S2 and S4 on the basis of resultant signals S0 output from the status register 30. The address latch 27 for latching 19-bit address A0 through A18 in response to, for example, control signals S4 supplied from the signal generating logic circuit 26 and control signals S5 supplied from the controller 21.

It should be noted that the terminals receiving address A0 through A3 also serves as test mode terminals $TEST_1$ through $TEST_4$ the voltage state of which is detected by the voltage detector 210 of the erase/program controller 21. And, the address latch 27 transfers 5-bit address A0 through A4 to a Y-gate subsection 281 in the storage section 28, 10-bit address A5 through A14 to a memory cell array 282 in the storage section 28, and 4-bit address A15 through A18 to a power supply controller 283 in the storage section 28.

The storage section 28 comprises a Y-gate (column gate) section 281, the memory cell array 282 and a source power supply controller 282. The Y-gates 281 select bit lines of a memory cell array on the basis of address A0 through A4 for supplying a program/erase voltage VPP. The memory cell array 282 consists of memory cells which data DIN are written to and read from on the basis of address A0 through A4 and which are formed of, for example, MOS transistors with a floating gate. The source power supply controller 283 is a circuit for controlling the supply of the program/erase voltage VPP on the basis of address A15 through A18.

The program/read amplifier 29 is a circuit for programming and reading data DIN on the basis of the control signals S3 and S4 and the program/erase voltage VPP. The status register 30 is a circuit for controlling the input/output of the erase/program controller 21 and the signal generating logic circuit 26 on the basis of four externally supplied signals of write enable WE, chip enable CE, output enable OE and power down PWD, and the resultant signal S0 supplied from the command register 24.

Figure 6:
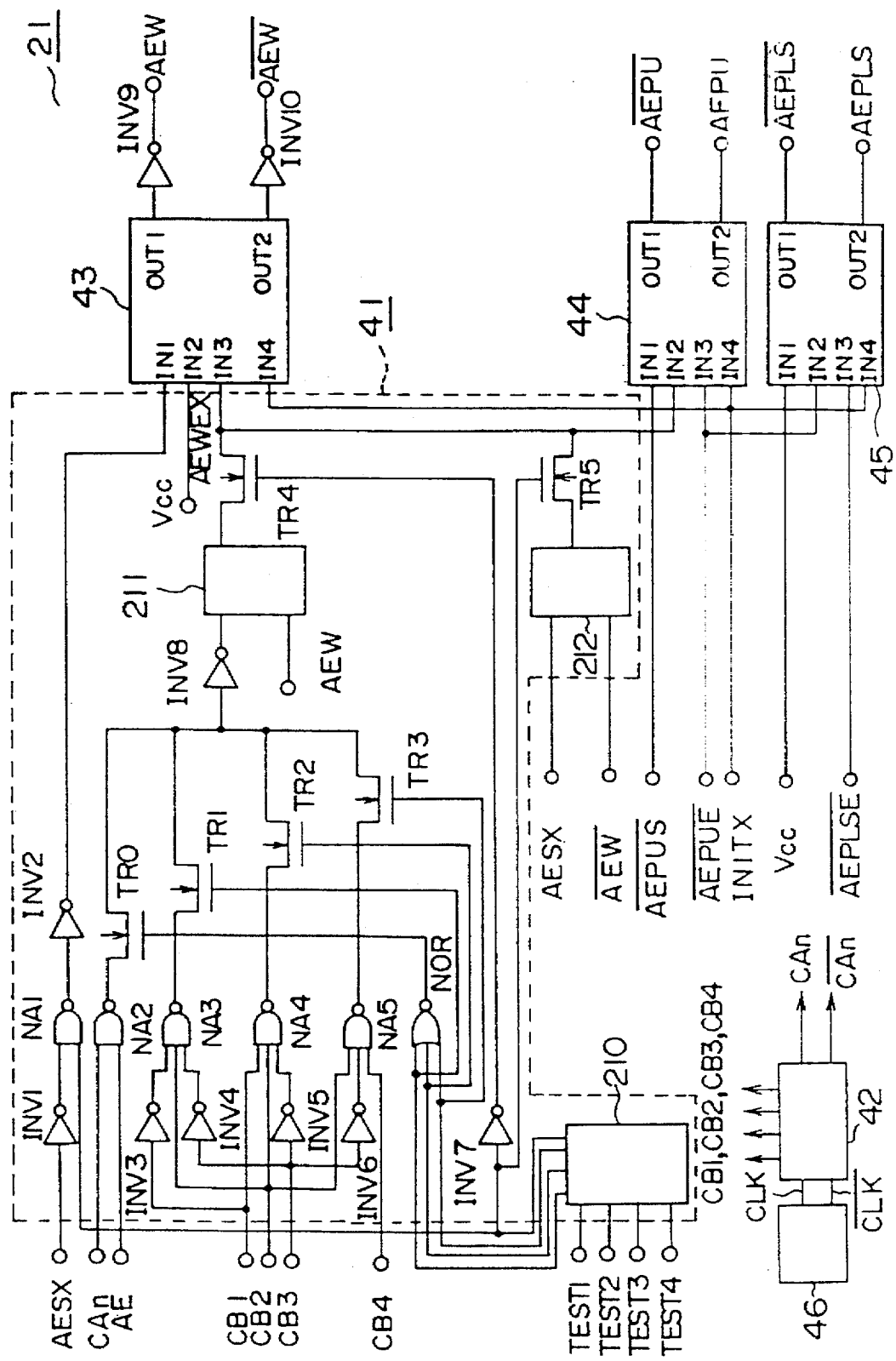
FIG. 6 is a diagram showing an arrangement of the erase/write controller of the flash memory shown in FIG. 5.

Referring to FIG. 6 through 9, we discuss the internal structure of an exemplary erase/program controller 21 in the following. For example, an erase/program controller 21 capable of setting up four kinds of write counts including zero in response to the selection of the test mode terminals TEST$_1$ through TEST$_4$ and operative for controlling erase and write according to an erase instruction comprises a write count setter 41, a counter 42, latches 43 through 45 and an oscillator 46 as shown in FIG. 6.

Specifically, the write count setter 41 is an illustrative embodiment of the automated count setter 11A and comprises a voltage detector 210, inverter INV1 through INV8, 2-input NAND gates NA1 and NA2, 3-input NAND gates NA3 through NA5, a 3-input NOR mates NOR, switching transistors TR0 through TR5 and trigger circuits 211 and 212.

FIG. 7 is an exemplary voltage detector 210 for monitoring the state of the voltages applied to the test mode terminals TEST$_1$, through TEST$_4$. In the detector 210 there is utilized a power supply voltage detector of Japan Patent Publication No. 60,789 issued in 1989 to the applicant of the present invention. The voltage detector 210 comprises four sub-detectors D1 through D4, for example.

Specifically, the sub-detector D1 comprises three p-type field effect transistors TP1 through TP3, an n-type field effect transistors TN, and inverter INV01 and INV02. The source of the transistor TP1 is connected to the terminal TEST$_1$, which also serves as a normal use terminal for receiving, for example, a column address A0. The gate and the drain of a transistor TP1 is connected to the source of the transistor TP2. The gate and the drain of the transistor TP2 is connected to the source of the transistor TP3. The drain of the transistor TP3 is connected to that of the transistor TN and the inverter INV01. The gates of the transistors TN and TP3 are pulled up together to the power supply VCC. The source of the transistor TN is connected to the ground line GND.

The function of the sub-detector D1 is such that when a high voltage VHH is applied to the terminal TEST$_1$, the sub-detector D1 detects it to output a count selection signal SH$_1$ to the write count setter 41.

As in the sub-detector D1, the sub-detectors D2 through D4 each comprise three p-type field effect transistors TH1 through TP3, an n-type field effect transistors TN, and inverter INV01 and INV02, for detecting a high voltage VHH applied to one of the terminals TP2 through TP4 to output the count selection signals SH$_2$ through SH$_4$, respectively. The terminals TEST$_2$ through TEST$_4$ also serves as usually used terminals for receiving column address bits A1 through A3, respectively.

The timing signal generator 200 of FIG. 4 comprises inverter INV1 through INV8, 2-input NAND gates NA1 and NA2, 3-input NAND gates NA3 through NA5, a 3-input NOR gate NOR, switching transistors TR0 through TR5, and trigger circuits 211 and 212. Specifically, the inverter INV1 and INV2 and the 2-input NAND gate NA1 give to a latch 43 a signal $\overline{AESX}$ on the basis of an auto-erase initiation signal AESX based on the result of erase command decoding and the count selection signal SH4. Note that the NAND gate NA1 receives a AESX signal and the count selection signal SH4.

The 2-input NAND gate NA2 yields a negated logical product signal of a signal Can (CA18) indicating the last count value of the counter 42 and an auto-erase signal AE to the transistor TR0. The logical signal is intended for writing data once before an auto-erase.

The gates INV3, INV4 and NA3 yields a negated logical product signal of counter signals $\overline{CB1}$, CB2 and $\overline{CB3}$ derived from the counter 42 to the transistor TR1. Similarly, the gates INV5 and NA4 gives a negated logical product signal of counter signals CB1, CB2 and $\overline{CB3}$ to the transistor TR2. The gates INV6 and NA5 gives a negated logical product signal of counter signals Cb2, $\overline{CB3}$ and CB4 to the transistor TR3. Note that the count signals CB1 through CB4 are count-setting-purpose ones for setting the write counts for 2, 3 and 10. And, the negated logical product signals are used for output control of the trigger circuit 211.

The gate NOR has its 3 inputs receiving the count selection signals SH1 through SH3 from the voltage selection signals SH1 through SH3 from the voltage detector 210 and its logical sum output connected to the gate of the transistor TR0. Also, the count selection signals SH1 through SH3 from the voltage detector 210 are supplied to the respective gates of the transistors TR1 through TR3.

Thus, each of the transistors TR0 through TR3 is controlled in response to the state of the voltage applied to corresponding one of the test mode terminals TEST1 through TEST3. Each gated output is supplied together to the trigger circuit 211 via the inverter INV8. The trigger circuit 211 supplies a pre-programming termination signal AEWEX to the transistor TR4 on the basis of logical combinations of the counter signals CB1 through CB4 which is selected by the transistors TR0 through TR3 and a pre-programming signal AEW.

The inverter INV7 inverts the count selection signal SH4 and supplies the inverted signal to the gate of the transistor TR4. A trigger circuit 212 supplies a signal AEWEX on the basis of signals AESX and $\overline{AEW}$ to the transistor TR5. The transistors TR4 and TR5 are controlled (gated) by the voltage state of the test mode terminal TEST$_4$ and have their gated outputs or the signals AEWEX wired together and supplied to the latches 43 and 44.

Figure 8:
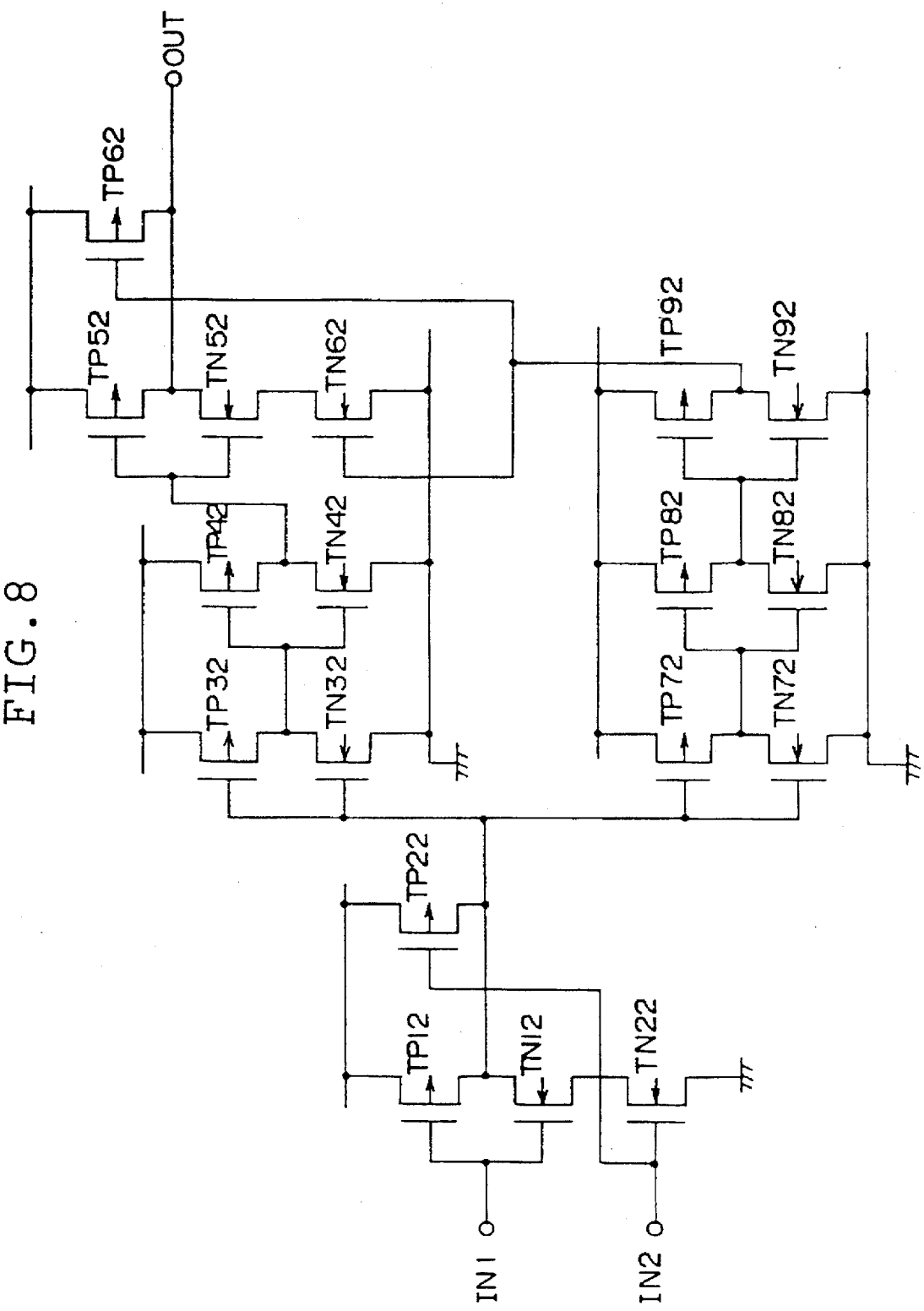
FIG. 8 is a diagram showing a structure of each trigger circuit in the erase/write controller shown in FIG. 6.

In FIG. 8, each of the trigger circuits 211 and 212 comprises 9 p-type field effect transistors TP12 through TP92 and 9 n-type field effect transistors TN12 through TN92. The input parts IN1 and IN2 of the trigger circuit 211 is supplied with inverter INV8 output signal and a signal AEW, respectively. Similarly, the input parts IN1 and IN2 of the trigger circuit 212 is supplied with signals AESX and $\overline{AEW}$. And, the trigger circuit 211 and 212 issue trigger output signals from their respective output ports OUT.

Figure 9:
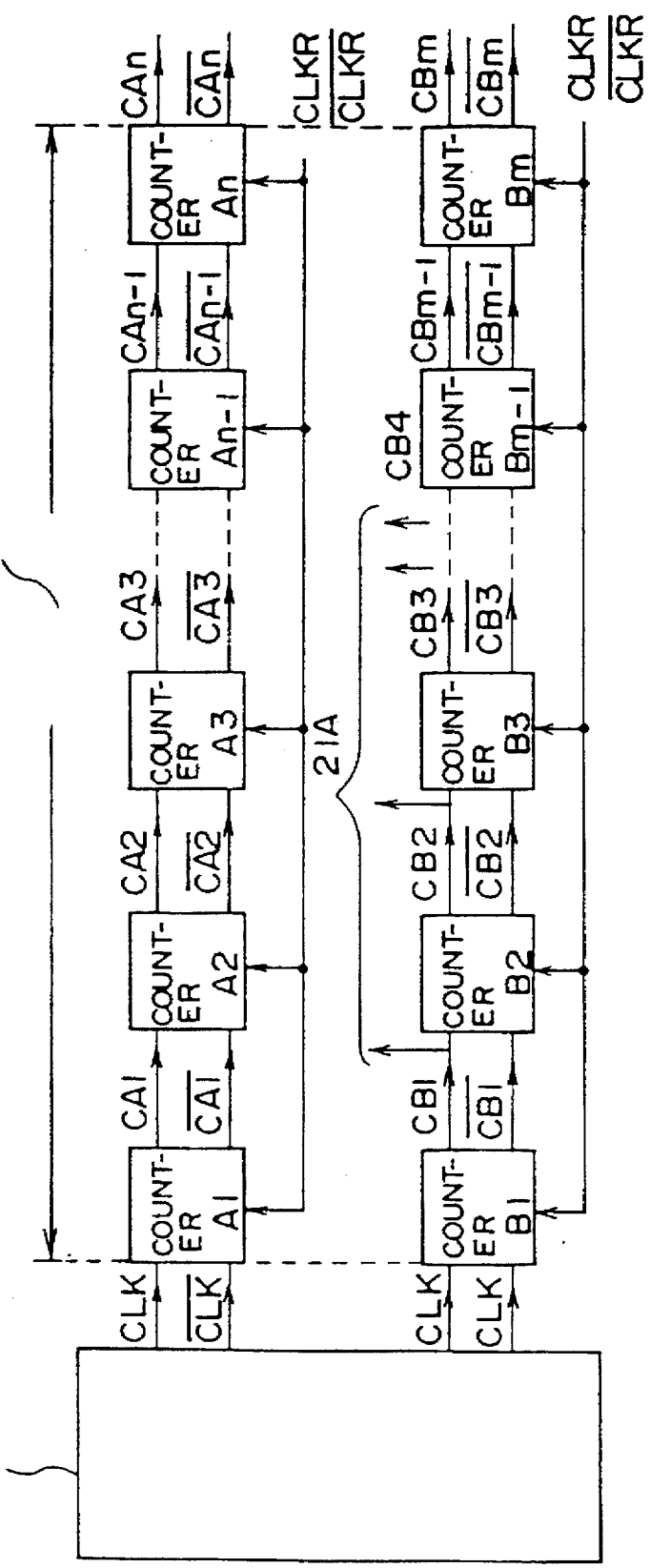
FIG. 9 is a diagram showing an overall structure of the counter in the erase/write controller shown in FIG. 6.

The counter circuit 42 is a counter for generating addresses or counting the number of writes or erases on the basis of a non-inverted clock signal CLK and an inverted clock signal $\overline{CLK}$. For example, as shown in FIG. 9, the counter circuit 42 comprises n counters A1 through An for generating addresses and m counters B1 through Bm for counting the number of writes or erases.

In a preferred embodiment of the invention, the non-inverted output signal CB1 of the counter B1 is supplied via inverter INV3 to the NAND gate NA3 and also Supplied to the NAND gate NA4. The non-inverted output signal CB2 of the counter B2 is supplied to the NAND gates NA3 through NA5. The non-inverted output signal CB3 of the counter B3 is supplied via inverter INV4 through INV6 to the respective NAND gates NA3 through NA5. The non-inverted output signal CB4 of the counter B4 is supplied to the NAND gate NA5.

Figure 10:
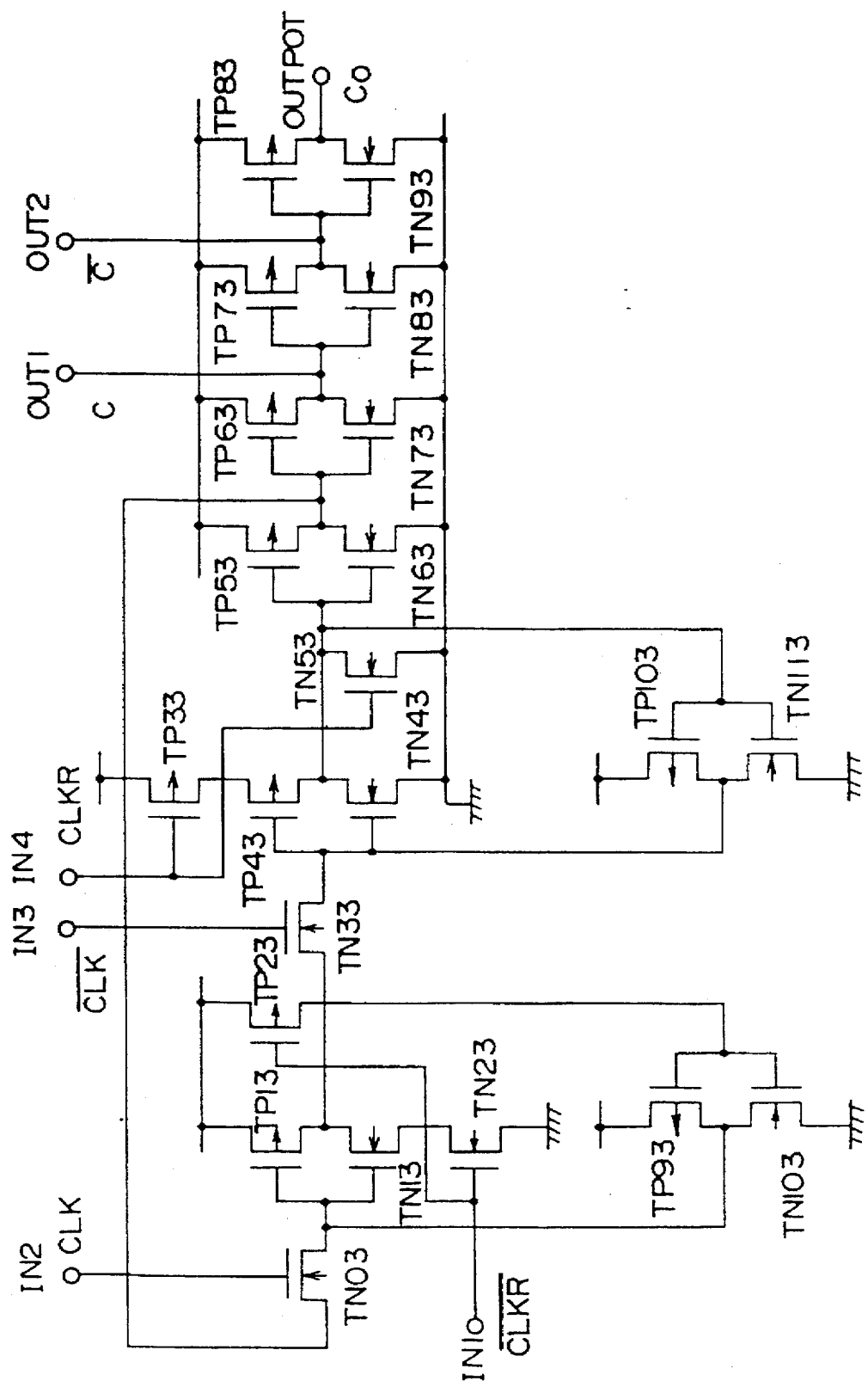
FIG. 10 is a diagram showing a structure of each counter circuit in the erase/write controller shown in FIG. 6.

As shown in FIG. 10, each counter comprises 10 p-type field effect transistors TP13 through TP103 and 12 n-type field effect transistors TN03 through TN113. To the input parts IN1 and IN4 of each counter, there are supplied a count clear signal CLKR and an inverted count clear signal $\overline{CLKR}$, respectively. And, each counter receives signals CLK and $\overline{\text{CLK}}$ at its input parts IN2 and IN3 and supplies a count output signal C and an inverted count output signal $\overline{\text{C}}$ from its output parts OUT1 and OUT2, respectively.

In a preferred embodiment of the invention, as shown in FIG. 6 and listed in Table below, the write counts N1 through N4 associated with the 4 test mode terminals TEST1 through TEST4 are made 2, 3, ,10 and 0, respectively.

TABLE

| TESTi | Ni [times] |
|---|---|
| TEST1 | 2 |
| TEST2 | 3 |
| TEST3 | 10 |
| TEST4 | 0 |

Specifically, the preceding circuit of the transistor TR1 associated with the test mode terminal TEST1 is so arranged as to activate its output to the transistor TR1 when the output CB1 through CB3 of the counter 42 becomes N1=2 in decimal or "010" in binary (by doing this, the terminal TEST1 is allocated for a write count N1), and the transistor TR1 is turned on in response to the voltage state of the test mode terminal TEST1 to select N1, resulting in the output of N1=2. Similarly, in order to output N2=3, the preceding circuit of the transistor TR2 is so arranged on the basis of the counter output condition (CB3, CB2, CB1)="011" that the terminal TEST2 is allocated for N2, and the transistor TR2 is turned on in response to the voltage state of the test mode terminal TEST2 to select N2. In order to output N3=10, the preceding circuit of the transistor TR3 is so arranged on the basis of the counter output condition (CB4, CB3, CB2)= "101" that the terminal TEST3 is allocated for N3=10, and the transistor TR3 is turned on in response to the voltage state of the test mode terminal TEST3 to select N3.

Figure 11:
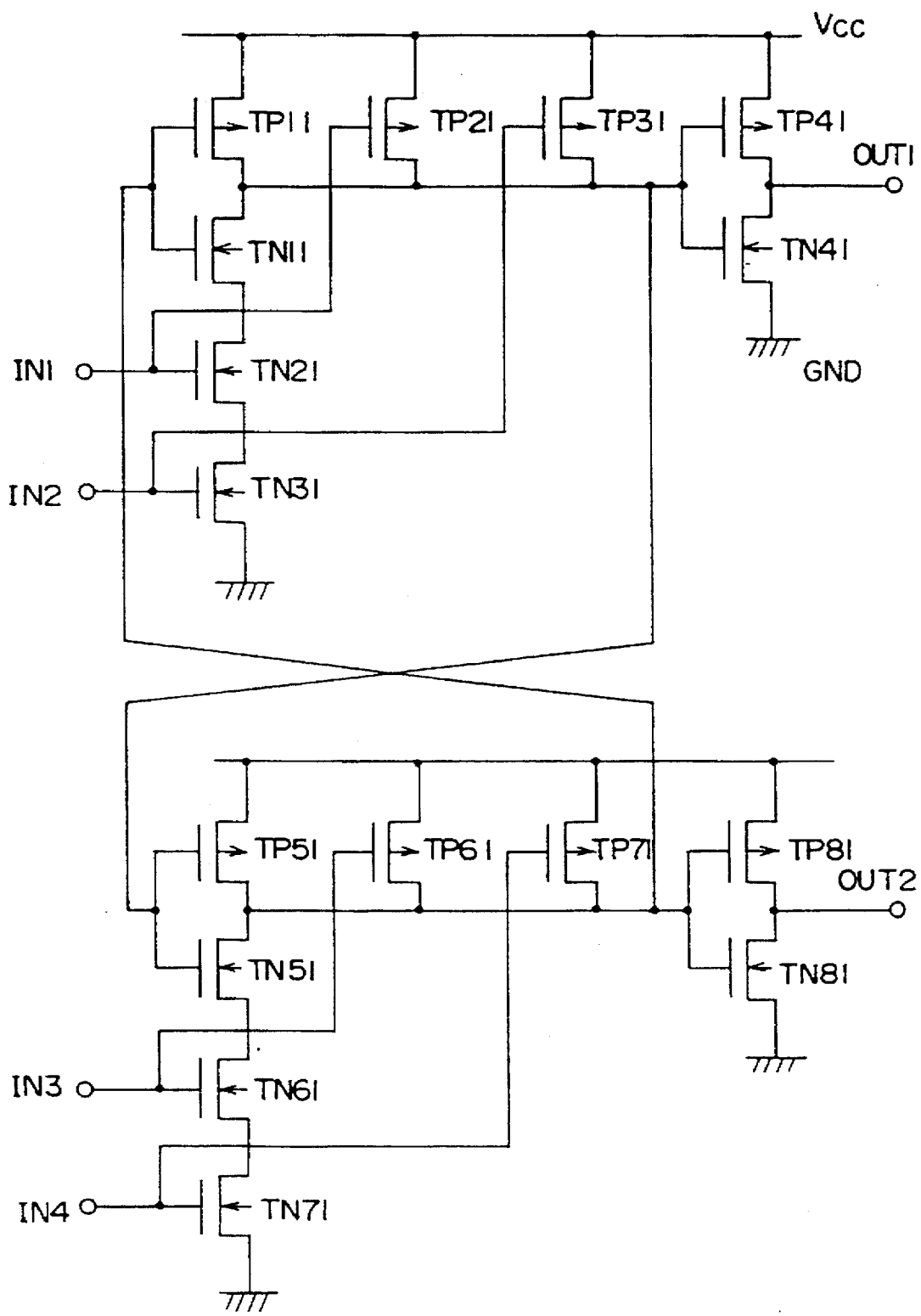
FIG. 11 is a diagram showing a structure of each latch circuit in the erase/write controller shown in FIG. 6.

The latch circuit 43 through 45 comprises 8 p-type field effect transistors TP11 through TP01 and 8 n-type field effect transistors TN11 through TN81 as shown in FIG. 11. As for the latch 43, as shown in FIG. 6, its input IN1 is connected to the inverter INV2 of the write count setter 41, its input INV2 is connected to the power supply line VCC, its input INV3 is connected to the transistors TR4 and TR5 of the write count setter 41 and the input INV4 of a latch circuit 44, its input IN4 is connected to the input IN4 of the latch 44 and the input IN4 of the latch 45, its output OUT1 is connected to the inverter INV9, and its output OUT2 is connected to the inverter INV10.

To the input IN1 of the latch 43 is supplied a signal $\overline{\text{AESX}}$ based on a auto-erase initiation signal AESX and a count selection signal SH4 and to its input IN2 is supplied the power supply voltage VCC. And, The latch 43 has its input IN3 supplied with a signal AEWEX and its input IN4 supplied with an initial signal INITX. On the basis of these signals, the latch 43 has its output OUT1 supplying a signal AEW via the inverter INV9 and its output OUT2 supplying a signal $\overline{\text{AEW}}$ via the inverter INV10.

An input IN1 of the latch 44 is connected to the point from which a signal $\overline{\text{AEPUS}}$ is supplied. The input IN2 of the latch 44 is as described above.

The input IN3 of the latch 44 is connected to an $\overline{\text{AEPUE}}$-supplying point and input IN2 of latch circuit 45. The $\overline{\text{AEPUE}}$ is erase-voltage-control-signal. Its input IN4 is as described above.

The latch 44 has its input IN1 supplied with a signal $\overline{\text{AEPUS}}$, its input IN2 supplied with a signal AEWEX, its input IN3 supplied with the erase voltage control signal $\overline{\text{AEPUE}}$ and its input IN4 supplied with a signal INITX. On the basis of these signals, the latch 44 has its output OUT1 supplying a non-inverted signal $\overline{\text{AEPU}}$ and its output OUT2 supplying an inverted signal AEPU.

As shown in FIG. 6, the latch 45 has its input IN1 connected to the power supply line VCC and its input IN3 connected to an $\overline{\text{AEPLSE}}$-supplying point. The $\overline{\text{AEPLSE}}$ is auto-erase-pulse-termination-signal. Its input IN2 and IN4 has been described above.

The latch 45 has its input IN1 supplies with the power supply voltage VCC, its input IN2 supplied with the signal $\overline{\text{AEPUE}}$, its input INS supplied with the auto-erase pulse termination signal $\overline{\text{AEPLSE}}$ and its input IN4 supplied with the signal INITX. On the basis of these signals, the latch 45 has its output OUT1 supplying a non-inverted auto-erase pulse signal $\overline{\text{AEPLS}}$ and its output OUT2 supplying an inverted signal AEPLS.

An oscillator 46 generates a reference clock signal CLK and its inverted version $\overline{\text{CLK}}$ to supply them to the counter circuit 42.

Now, we discuss the operation of the erase/write controller 21 in the following. If, for example, all the test mode terminals are in a unselected state (in the case of ordinary operation), then out of recognition that the mode should not enter any test mode, a data write is executed once before erasure and a (pre-programming termination) signal AEWEX for entering the auto-erase operation and an (auto-erase initiation) signal AESX are generated from by the write count setter 41.

On the basis of above described signals Can, AE, AESX and INITX and the power supply voltage VCC, the latch 43 has its output OUT1 supplying a signal AEW to be inverted by the inverter INV9 and its output OUT2 supplying a signal $\overline{\text{AEW}}$ to be inverted by the inverter INV10.

Similarly, on the basis of signals $\overline{\text{AEPUS}}$, AEWEX, $\overline{\text{AEPUE}}$ and INITX, the latch 44 has its output OUT1 supplying a signal $\overline{\text{AEPU}}$ and its output OUT2 supplying a signal AEPU.

Further, on the basis of the power supply voltage VCC and signals $\overline{\text{AEPUE}}$, INITX and $\overline{\text{AEPLSE}}$, the latch 45 has its output OUT1 supplying a signal $\overline{\text{AEPLS}}$ and its output OUT2 supplying a signal AEPLS.

In an automated erase and write test, if the test mode terminal, e.g., TEST4 is selected among the terminals TEST1 through TEST4, that is, a test-purpose high voltage VHH is applied to TEST4, then the write count setter 41 generates a pre-programming termination signal AEWEX for omitting a write before erasure (N4=0). The signal AEW based on to the signal AEWEX is output through the latch 43 output OUT1 and the inverter INV9. Similarly, the inverted signal $\overline{\text{AEW}}$ is output through the latch 43 output OUT2 and the inverter INV10.

Again, the latch 44 has its output OUT1 supplying a signal $\overline{\text{AEPU}}$ and its output OUT2 supplying a signal AEPU. And, the latch 45 has its output OUT1 supplying a signal $\overline{\text{AEPLS}}$ and its output OUT2 supplying a signal AEPLS.

Thus, a data write before erasure is eliminated. Subsequently, according to an erase instruction, the erase/write controller 21 executes an auto-erase test in which an erase operation is repeated.

Further, if any other test mode terminal TESTi than TEST4 is selected (i=1, 2, 3), then the count selection signal Shi associated with the selected terminal $\text{TEST}_i$ is activated thereby to select the write count Ni associated with the selected terminal $\text{TEST}_i$ among the predetermined write counts N1(=2), N2(=3) and N3(=10). In this way, a data write is executed Ni times before erasure, and then the signals AEWEX and AESX is generated by the write count setter 41 for entering an erase operation.

In this case, one of the transistors TR1 through TR3 operates in an "on" state which the activated count selection signal Shi is connected to. Also, when the test mode terminal TEST4 is in a unselected state, the transistor TR4 is "on" while the transistor TR5 is "off". In this case, the trigger circuit 211 generates a signal AEWEX as a trigger output on the basis of the output signal of the inverter INV8 and a signal AEW.

The signal AEW based on to the signal AEWEX is output through the latch 43 output OUT1 and the inverter INV9. Similarly, the inverted signal $\overline{AEW}$ is output through the latch 43 output OUT2 and the inverter INV10.

Again, the latch 44 has its output OUT1 supplying a signal $\overline{AEPU}$ and its output OUT2 supplying a signal AEPU. And, the latch 45 has its output OUT1 supplying a signal $\overline{AEPLS}$ and its output OUT2 supplying a signal AEPLS. Thus, data DIN is written Ni times in response to each case before erasure.

Concretely, on the basis of signals AEW, $\overline{AEW}$, AEPU, $\overline{AEPU}$, AEPLS and $\overline{AEPLS}$, the erase/write voltage generator 22 connected to the erase/write controller 21 write data DIN to the storage section 28 and subsequently executes a operation of erasing data DIN repeatedly.

Thus, in accordance with the flash memory according to a preferred embodiment of the invention, a erase/write controller 21 is provided with a write count setter 41 and a voltage detector 210 of the write count setter 41 is connected to test mode terminals TEST1 through TEST4 which serve double as an ordinary input and test terminal.

Therefore, it is possible to enter the test mode automatically by applying a high voltage to one of the test mode terminals TEST1 through TEST4 and to eliminate a pre-programming by applying the high voltage to the test mode terminal TEST4. It is also possible to change the pre-programming count in response to the selection among the terminals TEST1 through TEST3 and an erase command and to make a rewrite test only by means of an auto-erase.

Note that the selection of the terminal TEST4 causes the signal AESX to be neglected, so the signal AEW is not issued, nor is a pre-programming executed. Accordingly, only an auto-erase operation is executed, that is, following the first one-time programming, an erase operation is executed 1500 times or so. Since a write instruction directing a fixed number of data write according to the related art is disabled before an erase operation, an auto-erase is immediately started without wasting time for instruction decoding. So, a cycling test wherein a write and an erase operation (or an electrical rewrite) are repeated can be executed for a short time.

It should be noted that though we discussed the case of 4 write counts of 0, 2, 3 and 10 in a preferred embodiment of the invention, a desired number of write counts can be set by arranging the suitable combinations of the outputs of a counter for the write count.

Next, an operation performed at the erasing or the data stored in the flash memory is described with reference to FIGS. 12 and 13.

Figure 12:
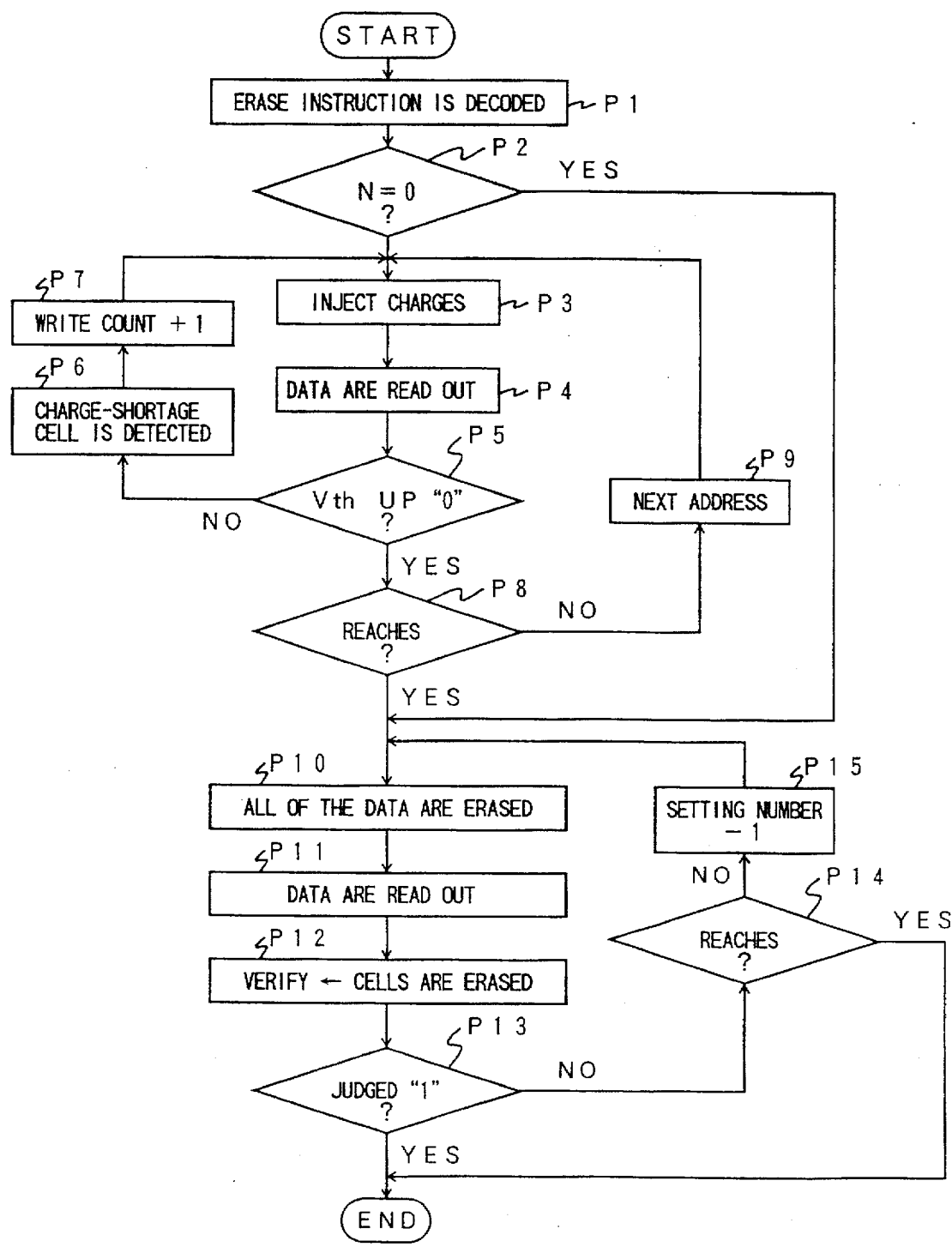
FIG. 12 is a control flowchart for erasing all data from the flash memory shown in FIG. 5.

In a flow chart shown in FIG. 12, in a step P1, an erase instruction transferred subsequent to a write instruction is initially decoded in the state machine 30. The write instruction is invalidated by the state machine 30. As a result of the decoding of the erase instruction, an AE signal, an AESX signal, an AEPUE signal, an INITX signal and an AEPLSE signal are generated in the state machine 30. These signals are output from the state machine 30 to the erase/program controller 21.

Thereafter, in a step P2, it is detected whether or not a repetition number N=0 of charge injection operations is selected. In cases where the data "0" are written in all of the memory cells of the flash memory to be tested because the charges have been injected into all of the memory cells, the repetition number N=0 is selected. In other cases, for example, when other test mode terminals TEST1 to TEST3 except for the particular test mode terminal T4 are selected, repetition number selecting signals SH1 to SH3 for respectively selecting one of repetition numbers N=2, 3 and 10 of writing operations set in advance are generated, and the data writing operation can be repeatedly operated before a data erasing by the repetition number N=2, 3 or 10. In this case, one of the transistors TR1 to TR3 is set to an "ON" condition in correspondence to applied voltage conditions of the test mode terminals TEST1 to TEST3.

In the erase/program controller 21, an AEWEX signal is output to the latching circuits 43 and 44 according to the count signals CB1 to CB4, the AE signal, the AEW signal and the CAn signal shown in FIG. 13 by the function of the write count setter 41.

Thereafter, in the latching circuit 43, the AESX signal is latched according to the INITX signal and the AEWEX signal, and the AEW signal and an inverted AEW signal are output to the row decoder 27B. Also, in the latching circuit 44, the AEPUE signal is latched according to the INITX signal and the AEWEX signal, and the AEPU signal and an inverted AEPU signal are output to the program/erase voltage generator 22. In the latching circuit 45, the AEPLSE signal is latched according to the INITX signal and the AEPUE signal, and the AEPLS signal and an inverted AEPLS signal are output to the source power supply controller 283.

Figure 1A:
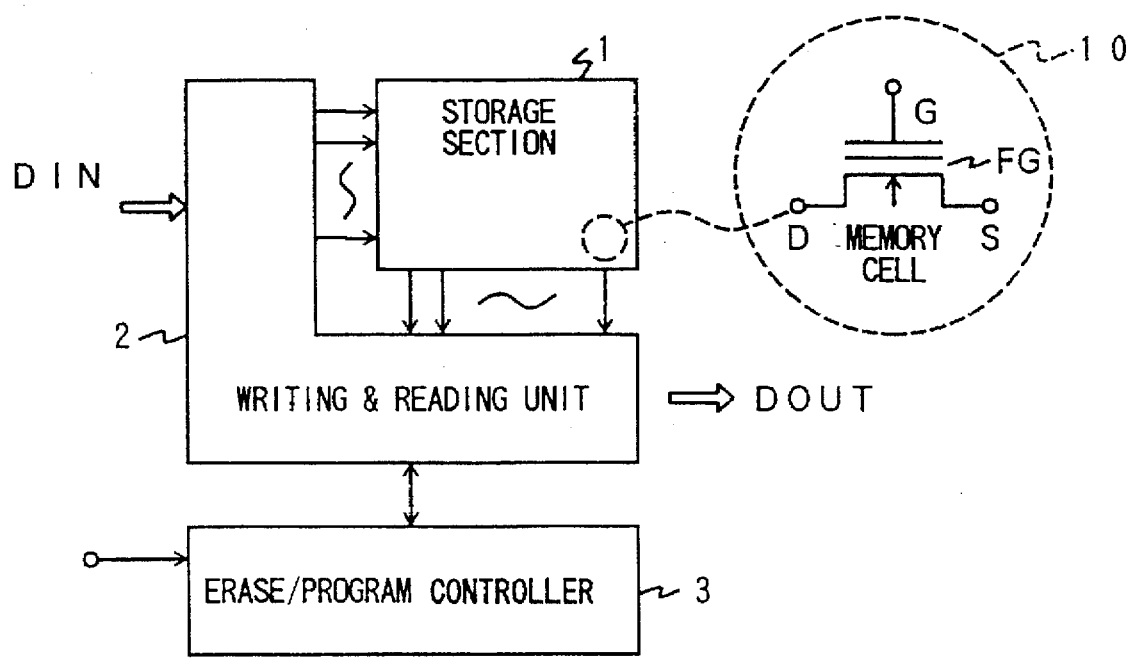
FIG. 1A with FIG. 1A-1 is a diagram showing an arrangement of a flash memory including an erase/write controller according to the related art of the invention.
Figure 1B:
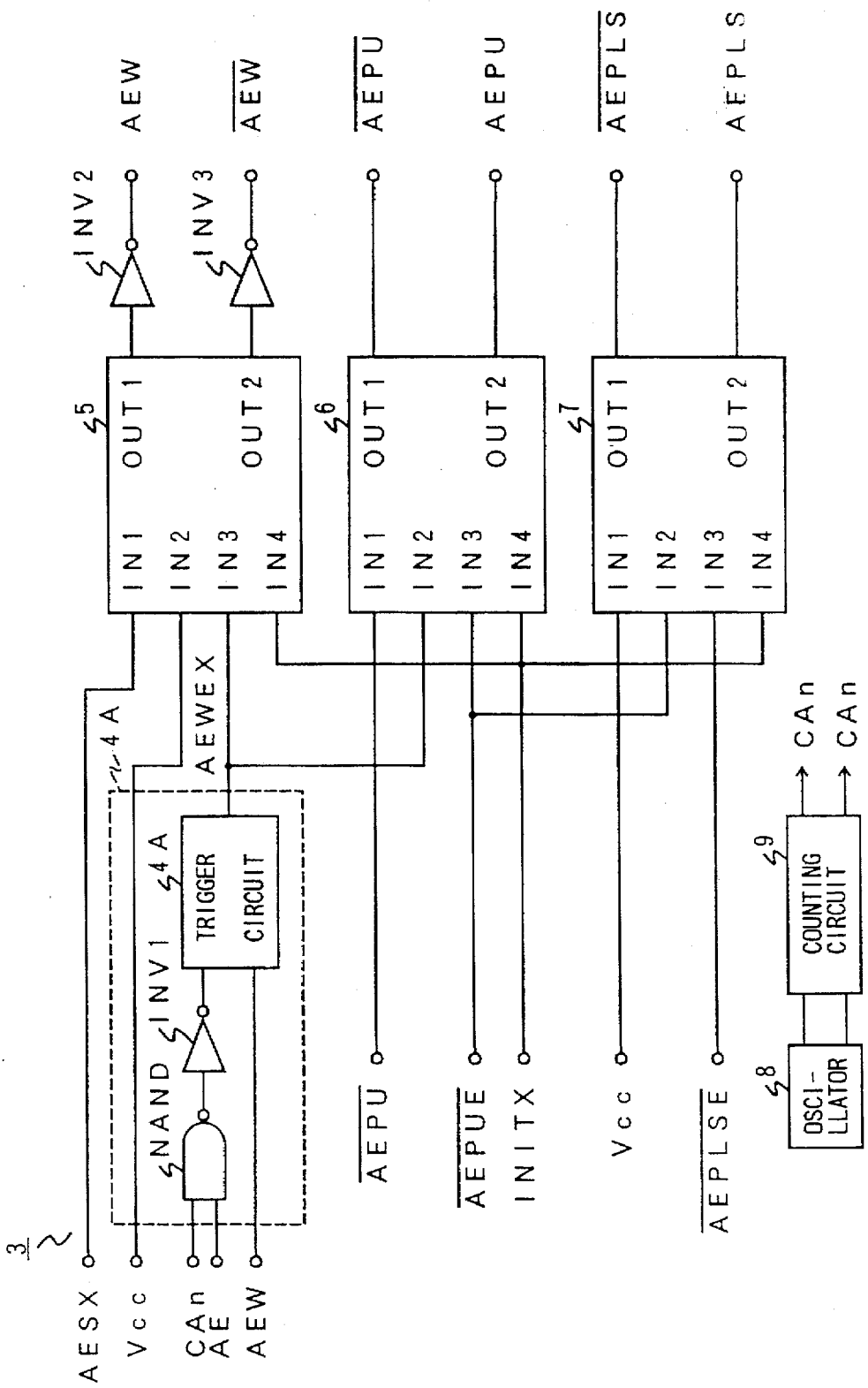
FIG. 1B is a diagram showing'g the internal structure of the erase/write controller shown in FIG. 1A.
Figure 1C:
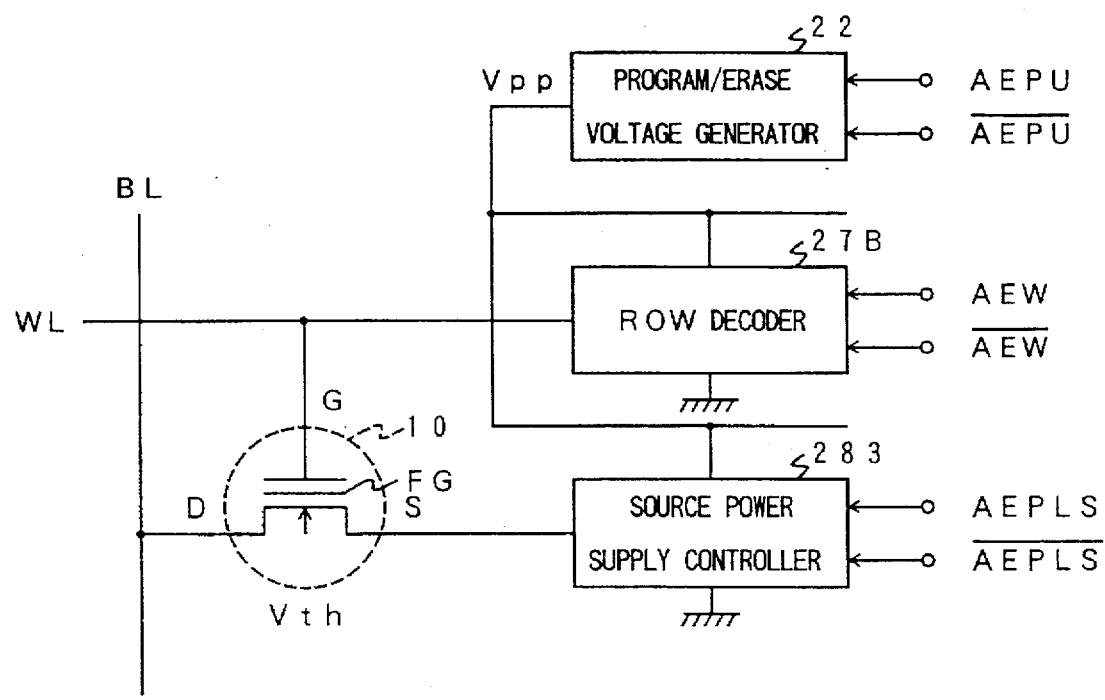
FIG. 1C is a schematic diagram showing a structure of a peripheral circuit of a memory cell shown in FIG. 1A.
Figure 1D:
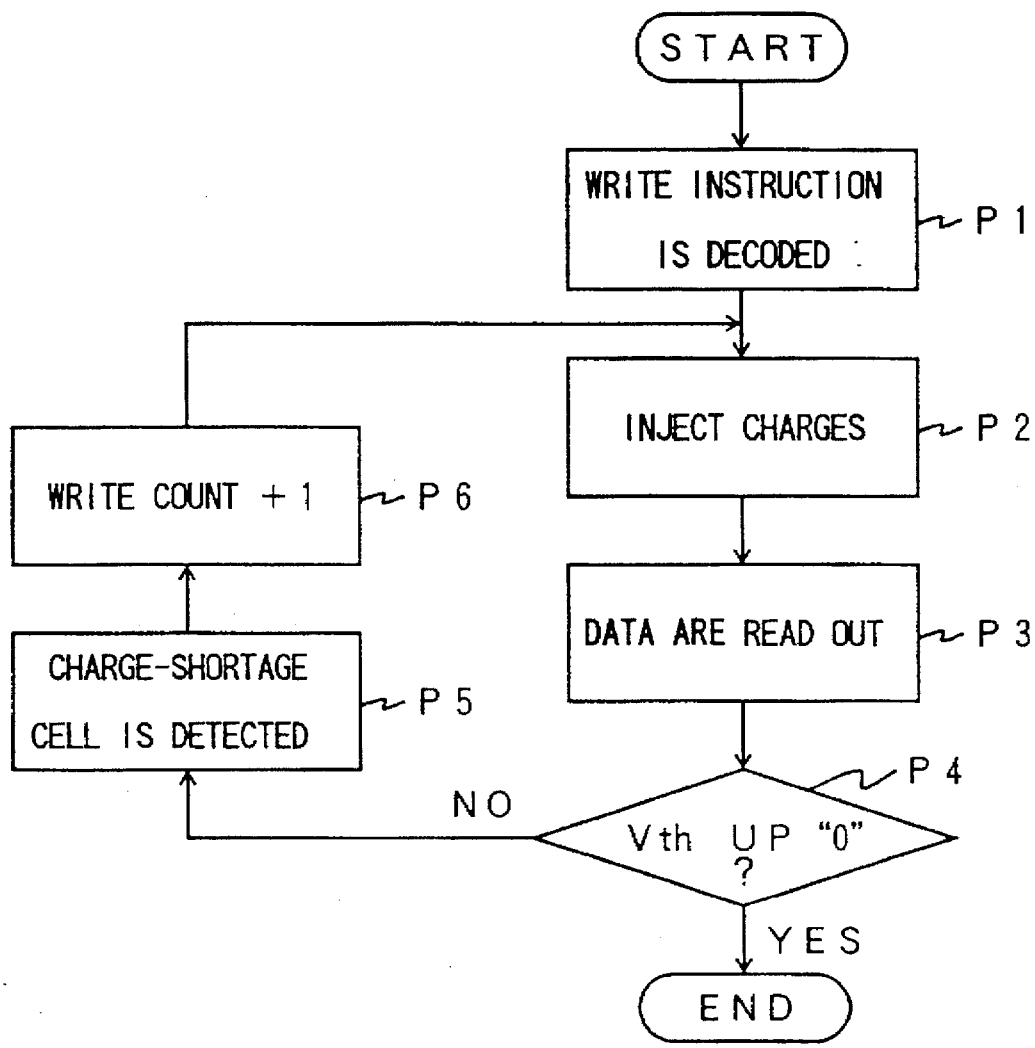
FIG. 1D is a control flowchart for equalizing threshold values of cells before data are erased from the flash memory shown in FIG. 1A.
Figure 1E:
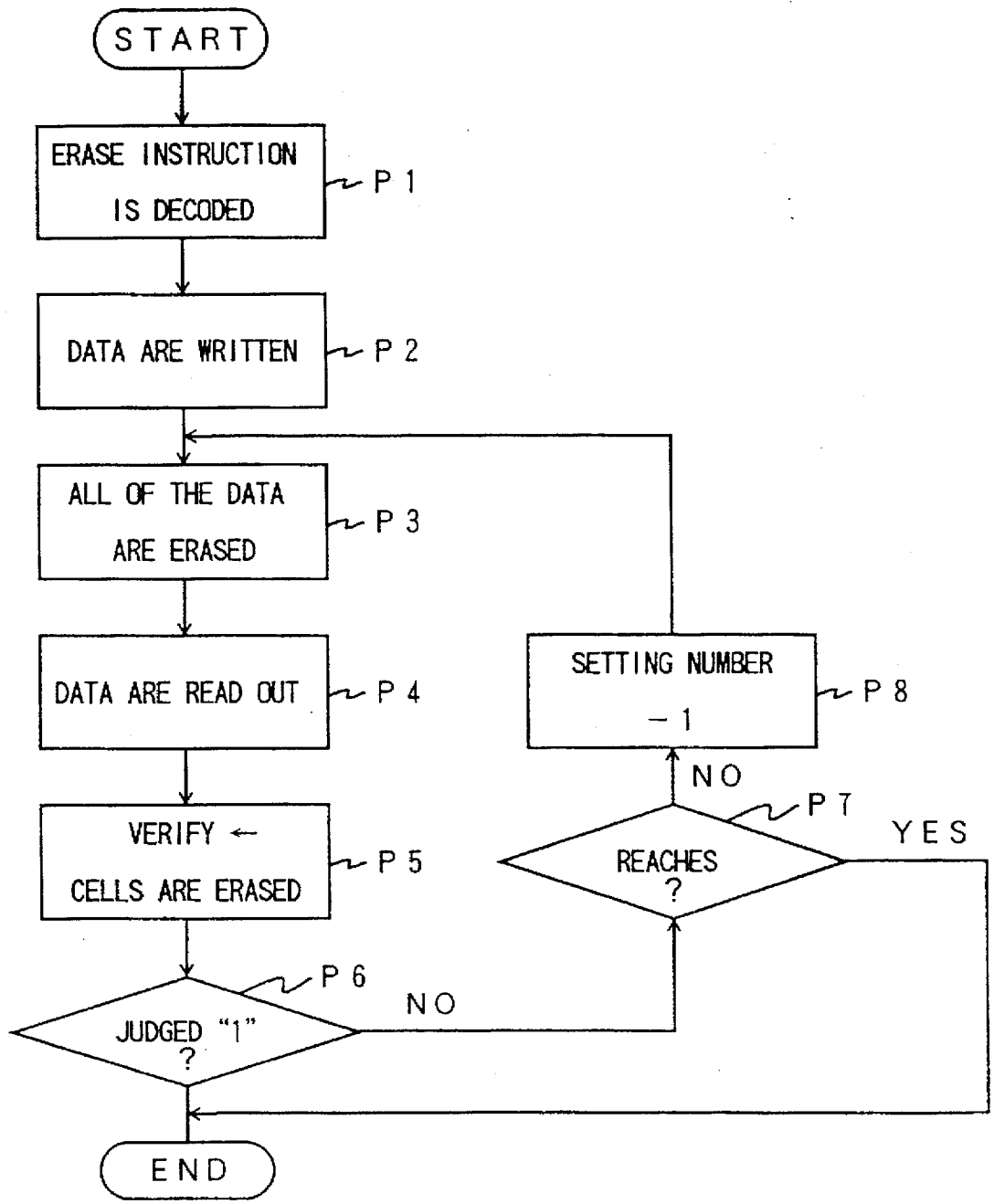
FIG. 1E is a control flowchart for erasing all data from the flash memory shown in FIG. 1A.

Thereafter, in a step P3, a piece of data DIN is written in a memory cell by the state machine 30. Here, because a charge is injected into a floating gate FG of the memory cell shown in FIG. 1C by the state machine 30, a VPP voltage is applied to a control gate G of the memory cell. The VPP voltage is supplied from the program/erase voltage generator 22 to the row decoder 27B according to the AEPUE signal and an inverted AEPUE signal.

Also, a word line WL of the memory cell is selected by the row decoder 27B in which the AEW signal and the inverted AEW signal are input. A source S of the memory cell is connected to the ground line GND through the source power supply controller 283 in which the AEPU signal and the inverted AEPU signal are input. Therefore, the charge is injected into the floating gate FG of the memory cell by receiving the VPP voltage supplied from the erase/program controller 21 to the row decoder 27B.

Thereafter, in a step P4, the data DIN is read out from the memory cell by the function of the write/read amplifier 29. In this case, the data DIN is read out bit by bit from the storage section 1 according to a read control signal S4 by the write/read amplifier 29.

Thereafter, in a step P5, the read data DIN is compared with a piece of expected value data in the data comparison register 25, and it is judged in the register 25 whether or not a threshold value Vth of the memory cell is increased. In cases where the charge is sufficiently injected into the floating gate of the memory cell and the threshold value Vth is sufficiently increased (YES), the procedure proceeds to a step P8. In contrast, in cases where the threshold value Vth is not sufficiently increased because the charge is not sufficiently injected into the floating gate of the memory cell (NO), the procedure proceeds to a step P6, the memory cell is detected as a charge-shortage memory cell, and the procedure proceeds to a step P7.

In the step P7, a repetition number of writing operations is incremented by the counter 42. Thereafter, the procedure returns to the step P3, a charge is again injected into the charge-shortage memory cell, and the data read out from the memory cell is again compared with the expected value data. This charge injection operation is repeated on condition that an upper limit of the repetition number of the charge injection operations is 2, 3 or 10. During the charge injection operations, clock signals transferred from the oscillator 46 are input to the counter 42, and CAn signals are output from the counter 42 to the write count setter 41.

Thereafter, in the step P8, it is judged whether or not threshold values Vth of all of the memory cells are equalized with each other. In cases where the threshold values Vth of all of the memory cells are not equalized with each other (NO), the procedure proceeds to a step P9, and a next address is specified to process a memory cell placed at the next address. In this case, the next address is supplied from the counter 42.

Thereafter, the procedure returns to the step P3, a piece of data DIN is written in another memory cell placed at the next address, and the data DIN is read out from the memory cell in the step P4 and is compared with a piece of expected value data. In cases where the threshold values Vth of all of the memory cells are equalized with each other (YES), the charge injection (or data write) operations performed before the data erasing are finished. Therefore, the write operation of the data DIN is repeatedly performed before the data erasing on condition that an upper limit of the repetition number of the write operations is 2, 3 or 10 for each of the memory cells, and the threshold voltages of all of the memory cells are equalized to a high level.

After the threshold values Vth of all of the memory cells are equalized with each other by performing the data write operations before the data erasing, in a step P10, the data of all of the memory cells are erased at a time by the state machine 30. Also, a VPP voltage supplied from the erase/program controller 21 to the source power supply controller 283 is received in each of the memory cells, and hot electrons are drawn out from the floating gates FG of the memory cells through a Fowler-Nordheim tunnel.

In this case, the memory cells are cut off from the word lines WL according to the AEW signal and the inverted AEW signal by the function of the row decoder 27B, and the control gates G of the memory cells are connected to the ground line GND. In the source power supply controller 283, the sources S of the memory cells are cut off from the ground line GND and are connected to the program/erase voltage generator 22, and the voltages VPP are supplied to the sources S of the memory cells according to the AEPLS signal and the inverted AEPLS signal.

Thereafter, in a step P11, the data are read out from the storage section 28 to the write/read amplifier 29. In this case, the data are read out bit by bit from the storage section 28 to the write/read amplifier 29 according to a read control signal and a read address. Here, the control gates G of the memory cells 10 are cut off from the ground line GND according to the AEW signal and the inverted AEW signal and are connected to the word lines WL by the function of the row decoder 27B. Also, the sources of the memory cells 10 are cut off from the program/erase voltage generator 22 according to the AEPLS signal and the inverted AEPLS signal and are connected to the ground line GND by the function of the source power supply controller 283.

Thereafter, in a step P12, to verify the erasing of the data stored in all of the memory cells, each of the data read out is compared with the expected value data in the data comparison register 25. Thereafter, in a step P13, it is judged in the state machine 30 whether or not the data of all of the memory cells are erased. Here, in cases where the data of all of the memory cells are erased (YES), the data easing test is finished.

In contrast, in cases where the data of all of the memory cells are not erased (NO), it is judged in the state machine 30 in the step P14 whether or not a repetition number of erasing operations reaches a prescribed repetition number. In cases where the repetition number of erasing operations does not reach the prescribed repetition number (NO), the procedure proceeds to a step P15, a set repetition number is decreased by one, and pieces of data are written in the memory cells in the step P9. Thereafter, the procedure proceeds to the step P10, and the data are erased at a time. The procedure returns to the step P11, the data is read out from the storage section 28, the erasing of the data is verified in the step P12, and it is judged in the step P13 whether or not the data of all of the memory cells are erased.

By repeating the procedure from the step P10 to the step P15, i the state machine 30, the data of the memory cells are repeatedly erased within the prescribed repetition number, the data are read out, and it is tested whether or not the erasing of the data is normally performed.

In cases where the flash memory is tested on condition that the charges have been already injected into the memory cells in the step P2, for example, a particular test mode terminal TEST4 is selected from among the test mode terminals TEST1 to TEST4. In this case, when a test voltage VHH is applied to the terminal TEST4, an AEWEX signal indicating that a write operation performed before an automatic erasing of the data is to be omitted (N=0) is generated from the writing repetition number setting unit 41. As shown in FIG. 13, a pulse of the AEWEX signal is fallen with a pulse of the inverted AEW signal in synchronization that a pulse of the AESX signal is fallen. Thereafter, an AEW signal generated in synchronization with the AEWEX signal is output from an output OUT1 of the latching circuit 43 to the row decoder 27B through the inverter INV9. In the same manner, the inverted AEW signal is output from an output OUT2 of the latching circuit 43 to the row decoder 27B through the inverter INV10. Here, a write period before a data erasing is omitted in the time charts shown in FIGS. 2 and 13.

Also, an inverted AEPU signal is output from an output OUT1 of the latching circuit 44 to the program/erase voltage generator 22. In the same manner, an AEPU signal is output from an output OUT2 of the latching circuit 44 to the program/erase voltage generator 22. Also, an inverted AEPLS signal is output from an output OUT1 of the latching circuit 45 to the source electric power control circuit 283. In the same manner, an AEPLS signal is output from an output OUT2 of the latching circuit 45 to the source electric power control circuit 283.

Thereafter, the data of all of the memory cells are erases at a time in the step P10. Therefore, the charge injection (or a data write) operations performed before an automatic erasing in the steps P3 to P9 are omitted, and an automatic erasing test in which the erasing operation is repeated in the steps P10 to P15 described hereinbefore is performed in the erase/program controller 21 according to the erase instruction.

As a result, in cases where the data of all of the memory cells are erased in the step P13 and the erasing repetition number reaches the prescribed repetition number in the step P14 (YES), the data erasing operation is finished. When the data erasing test is finished, a test result is transferred to an external testing apparatus.

As is described above, in the flash memory according to the preferred embodiment of the present invention, as shown in FIGS. 5 to 13, the writing repetition number setting unit 41 is arranged in the erase/program controller 21, and the voltage detector 210 of the writing repetition number setting unit 41 is connected to the particular test mode terminals TEST1 to TEST4 which each are normally utilized as an input terminal and a test terminal.

Therefore, when a high voltage is applied to one of the particular test mode terminals TEST1 to TEST4, the test mode can be automatically set. Also, when a high voltage is applied to the particular test mode terminal TEST4, the data write operation performed before the data erasing can be omitted. Also, the repetition number of write operations performed before the data erasing can be set to be changeable according to the erase instruction and the positional selection of the terminals TEST1 to TEST3, and a rewriting test can be performed by only the automatic erasing.

In cases where the terminal TEST4 is selected, the AESX signal is ignored, the AEW signal is not generated, and the data write operation to be performed before the data erasing is not performed. Accordingly, in cases where the data have been already written in all of the memory cells, only the automatic erasing can be performed according to the AEPLS signal. Therefore, because the write instruction preceding to the erase instruction can be invalidated, a useless time required to execute the write instruction is not required, and the automatic erasing can be immediately performed. As a result, a cycling test in which the write operation of the data and the erasing operation of the data are alternately repeated (or an electric rewriting operation) can be performed at a short time.

Also, in the preferred embodiment of the present invention, four types of repetition numbers N=0, 2, 3 and 10 of writing operations are described. However, various types of repetition numbers of writing operations can be set by properly combining counter outputs respectively corresponding to a repetition number of writing operations.

In the embodiment of the present invention, the flash memory in which the data "1" has been already written in all of the memory cells is described as a memory to be tested. However, it is applicable that a step in which the write instruction which instructs to write the data in the memory cells before the automatic erasing is invalidated, a repetition number of charge injection operation is set to 1, a data write operation is once performed and an automatic erasing of the data is performed be added.

What is claimed is:

1. A non-volatile semiconductor memory in which pieces of data stored in a plurality of memory cells are erasable at a time, comprising:

invalidating means for invalidating a write instruction which instructs to equalize a plurality of threshold voltages of the memory cells with each other by injecting a plurality of charges into the memory cells in advance before an erasing of the data stored in the memory cells; and performing means for performing a write operation to write pieces of data in the memory cells and an erase operation of the data according to an erase instruction subsequent to the write instruction invalidated by the invalidating means.

2. A non-volatile semiconductor memory with a self-test function in which pieces of data are erasable at a time and write and read operations of pieces of data are tested, comprising:

a memory cell having a floating gate;

selecting means for selecting a repetition number of charge injection operations performed to inject a charge into the floating gate of the memory cell;

a writing circuit repeatedly writing a piece of data in the memory cell by repeatedly injecting a charge into the floating gate of the memory cell within the repetition number selected by the selecting means;

an erasing circuit repeatedly erasing the data repeatedly written in the memory cell by the writing circuit by drawing out the charge injected into the memory cell;

a reading circuit reading the data either from the memory cell from which the charge is drawn out by the erasing circuit or the memory cell into which the charge is injected by the writing circuit;

a judging circuit judging the data read out from the memory cell by the reading circuit to test write and read operations of the data; and a control circuit generating a control signal according to an erase instruction transferred from an outside and a piece of charge injecting information transferred from the selecting means and performing an erasing test of the data by outputting the control signal to the selecting means, the writing circuit, the erasing circuit, the reading circuit and the judging circuit.

3. The non-volatile semiconductor memory according to claim 2 in which the selecting means comprises:

a terminal in which the repetition number of charge injection operations is set;

a voltage detecting circuit for detecting a voltage applied to the terminal and outputting a repetition number selecting signal;

a counter for outputting a charge injection number signal indicating the repetition number of charge injection operations set in the terminal; and a timing generating circuit for selecting the charge injection number signal output from the counter according to the repetition number selecting signal output from the voltage detecting circuit and generating a pre-erasing write signal according to the charge injection number signal, the data being written in the memory cell by the writing circuit by using the pre-erasing write signal as a timing of said write operation.

4. The non-volatile semiconductor memory according to claim 2, further comprising:

invalidating means for invalidating an instruction which instructs to equalize a threshold voltage of the memory cell to a constant value, the data being written in the memory cell by the writing circuit according to a second instruction subsequent to the instruction invalidated.

5. The non-volatile semiconductor memory according to claim 2 in which the selecting means comprises:

an address terminal for receiving the repetition number of charge injection operations set in advance.

6. The non-volatile semiconductor memory according to claim 2 in which the selecting means comprises:

an address terminal for receiving a first voltage to select the memory cell placed at an address and receiving a second voltage higher than the first voltage to select the repetition number of charge injection operations set in advance.

7. A test method of a non-volatile semiconductor memory in which pieces of data stored in a plurality of memory cells are erasable at a time, comprising the steps of:

invalidating a write instruction which instructs to equalize a plurality of threshold voltages of the memory cells with each other by injecting a plurality of charges into the memory cells in advance before an erasing of the data stored in the memory cells; and performing a write operation to write pieces of data to be erased in the memory cells and an erase operation of the data according to an erase instruction subsequent to the write instruction invalidated.

8. A test method of a non-volatile semiconductor memory with a self-test function in which pieces of data are erasable at a time and write and read operations of pieces of data are tested, comprising the steps of:

receiving an erasing instruction which instructs to erase pieces of data stored in a plurality of memory cells; receiving a piece of repetition number selecting information to select a repetition number of charge injection operations;

selecting either a first processing in which a charge injection operation of a charge into each of the memory cells and an erasing operation of pieces of data written in the memory cells according to the charge injection operation at a time are alternatively performed within the limits of the repetition number of charge injection operations according to the erasing instruction to equalize threshold voltages of the memory cells or a second processing in which injection of a charge into each of the memory cells is omitted according to the repetition number selecting information and pieces of data written in the memory cells are repeatedly erased at a time according to the erasing instruction; and performing the first or second processing selected.

9. The test method of a non-volatile semiconductor memory according to claim 8 in which the step of receiving a piece of repetition number selecting information includes:

receiving the repetition number selecting information indicating a zero repetition number of charge injection operations, injection of a charge into each of the memory cells being omitted according to the repetition number selecting information.

10. The test method of a non-volatile semiconductor memory according to claim 8 in which the step of receiving a piece of repetition number selecting information includes:

receiving the repetition number selecting information indicating a desired repetition number of charge injection operations, the charge injection operation and the erasing operation alternately performed being repeated by the desired repetition number according to the repetition number selecting information.

* * * * *